US012684954B2

(12) United States Patent  
Yuk et al.

(10) Patent No.: US 12,684,954 B2  
(45) Date of Patent: Jul. 14, 2026

(54) DISPLAY APPARATUS

(71) Applicant: Samsung Display Co., Ltd., Yongin-si (KR)

(72) Inventors: Simbum Yuk, Yongin-si (KR); Minjae Kim, Yongin-si (KR); Minhee Kim, Yongin-si (KR); Taehoon Kim, Yongin-si (KR); Joonhyung Park, Yongin-si (KR); Hanjun Yu, Yongin-si (KR); Dokyung Youn, Yongin-si (KR); Changhun Lee, Yongin-si (KR); Kangseob Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 683 days.

(21) Appl. No.: 18/076,197

(22) Filed: Dec. 6, 2022

(65) Prior Publication Data

US 2023/0189575 A1    Jun. 15, 2023

(30) Foreign Application Priority Data

Dec. 9, 2021    (KR) ........................ 10-2021-0176111

(51) Int. Cl.  
*H10K 59/122* (2023.01)  
*H10K 50/86* (2023.01)  
*H10K 59/88* (2023.01)

(52) U.S. Cl.  
CPC ......... *H10K 59/122* (2023.02); *H10K 50/865* (2023.02); *H10K 59/88* (2023.02)

(58) Field of Classification Search  
CPC .... H10K 59/122; H10K 50/865; H10K 59/88; H10K 59/8722; H10K 59/38; H10K 50/841; H10K 50/844; H10K 59/127  
See application file for complete search history.

(56) References Cited

U.S. PATENT DOCUMENTS 9,461,098 B2    10/2016    Choi et al.  
2019/0157362 A1    5/2019    Rho  
(Continued)

FOREIGN PATENT DOCUMENTS

JP        2015128027 A  *  7/2015  .......... H10K 59/879  
KR    10-2019-0058745 A        5/2019  
(Continued)

*Primary Examiner* — Steven B Gauthier  
*Assistant Examiner* — Alvin L Lee  
(74) *Attorney, Agent, or Firm* — Womble Bond Dickinson (US) LLP

(57) ABSTRACT

A display apparatus includes: a first pixel electrode in a display area; a pixel defining layer with a first pixel opening defined in the pixel defining layer exposing a center of the first pixel electrode; an emission layer over the first pixel electrode and configured to emit light in a first wavelength band; an opposite electrode over the emission layer; a second substrate over the first substrate such that the opposite electrode is between the first substrate and the second substrate; a bank over a bottom surface of the second substrate in a direction to the first substrate, a first opening defined in the bank overlapping with the first pixel opening and a first additional opening defined in the bank overlapping with the peripheral area, a first quantum dot layer in the first opening; and a bonding member bonding the first substrate and the second substrate to each other.

25 Claims, 18 Drawing Sheets

(56)                    References Cited

U.S. PATENT DOCUMENTS

| | | | |
|---|---|---|---|
| 2019/0162993 A1* | 5/2019 | Hong | ............... G02F 1/133707 |
| 2019/0227385 A1* | 7/2019 | Ahn | .................... G02F 1/13454 |
| 2021/0175459 A1 | 6/2021 | Lee et al. | |
| 2021/0202587 A1 | 7/2021 | Kim et al. | |
| 2021/0202615 A1 | 7/2021 | Kim | |
| 2021/0384467 A1 | 12/2021 | Park et al. | |

FOREIGN PATENT DOCUMENTS

| | | |
|---|---|---|
| KR | 10-2056666 B1 | 12/2019 |
| KR | 10-2021-0073199 A | 6/2021 |
| KR | 10-2021-0086044 A | 7/2021 |
| KR | 10-2021-0086791 A | 7/2021 |
| KR | 10-2280423 B1 | 7/2021 |
| KR | 10-2021-0152102 A | 12/2021 |

* cited by examiner

DISPLAY APPARATUS

CROSS-REFERENCE TO RELATED APPLICATION

The present application claims priority to and the benefit of Korean Patent Application No. 10-2021-0176111, filed on Dec. 9, 2021, in the Korean Intellectual Property Office, the entire disclosure of which is incorporated herein by reference.

BACKGROUND

1. Field

Aspects of one or more embodiments relate to a display apparatus.

2. Description of the Related Art

A display apparatus has a plurality of pixels. For a full-color display apparatus, the plurality of pixels may emit light having various colors. To do so, at least some of pixels in a display apparatus may have color conversion units. Accordingly, light having a first color generated from emission units of some pixels may be converted into light having a second color via a corresponding color conversion unit and emitted to the outside.

The above information disclosed in this Background section is only for enhancement of understanding of the background and therefore the information discussed in this Background section does not necessarily constitute prior art.

SUMMARY

Aspects of one or more embodiments relate to a display apparatus, and for example, to a display apparatus by which relatively high-quality images are displayed.

However, some display apparatuses may not emit light having uniform color coordinates or luminance according to positions of pixels.

Aspects of one or more embodiments may include a display apparatus with which high-quality images may be displayed. However, this is merely an example, and the scope of the embodiments is not limited thereto.

Additional aspects will be set forth in part in the description which follows and, in part, will be apparent from the description, or may be learned by practice of the presented embodiments of the disclosure.

According to one or more embodiments, a display apparatus includes a first substrate having a display area and a peripheral area outside the display area, a first pixel electrode over the first substrate to be in the display area, a pixel defining layer covering an edge of the first pixel electrode such that a first pixel opening defined in the pixel defining layer exposes a center of the first pixel electrode, an emission layer over the first pixel electrode, the emission layer from which light having a wavelength in a first wavelength band is emitted, an opposite electrode over the emission layer, a second substrate over the first substrate such that the opposite electrode is between the first substrate and the second substrate, a bank over a bottom surface of the second substrate in a direction to the first substrate, a first opening defined in the bank overlapping with the first pixel opening and a first additional opening defined in the bank overlapping with the peripheral area, a first quantum dot layer in the first opening, and a bonding member located between the first substrate and the second substrate and bonding the first substrate and the second substrate to each other.

According to some embodiments, the bonding member may overlap the first additional opening.

According to some embodiments, the bonding member may be apart from the bank.

According to some embodiments, the display apparatus may further include a first dummy quantum dot layer located in the first additional opening, the first dummy quantum dot layer including a same material as the first quantum dot layer.

According to some embodiments, the first quantum dot layer may convert light having a wavelength in the first wavelength band and passing through the first quantum dot layer into light having a wavelength in a second wavelength band.

According to some embodiments, the bonding member may fill the first additional opening.

According to some embodiments, the display apparatus may further include an overcoat layer covering the bank and the first quantum dot layer, the overcoat layer filling the first additional opening, and the bonding member may contact the overcoat layer.

According to some embodiments, the display apparatus may further include a filler filling a space between the opposite electrode and the bank, and the filler may fill the first additional opening.

According to some embodiments, the display apparatus may further include a second pixel electrode over the first substrate to be in the display area, wherein the pixel defining layer covers an edge of the second pixel electrode such that a second pixel opening defined in the pixel defining layer exposes a center of the second pixel electrode, the emission layer is over the second pixel electrode, the second opening defined in the bank overlaps the second pixel opening, and the display apparatus may further include a second quantum dot layer or a light-transmitting layer, in the second opening.

According to some embodiments, a second additional opening is defined in the bank to overlap the peripheral area, and the bonding member overlaps the second additional opening.

According to some embodiments, the display apparatus may further include a first dummy quantum dot layer in the first additional opening, the first dummy quantum dot layer including a same material as the first quantum dot layer, and a second dummy quantum dot layer or a dummy light-transmitting layer, in the second additional opening, wherein the second dummy quantum dot layer may include a same material as the second quantum dot layer and the dummy light-transmitting layer may include a same material as the light-transmitting layer.

According to some embodiments, the first quantum dot layer may convert light having a wavelength in the first wavelength band and passing through the first quantum dot layer into light having a wavelength in a second wavelength band, and the second quantum dot layer may convert light having a wavelength in the first wavelength band and passing through the second quantum dot layer into light having a wavelength in a third wavelength band.

According to some embodiments, the bonding member may fill the first additional opening and the second additional opening.

According to some embodiments, the display apparatus may further include a second dummy quantum dot layer in the second additional opening, the second dummy quantum dot layer including a same material as the second quantum dot layer.

According to some embodiments, the second quantum dot layer may convert light having a wavelength in the first wavelength band and passing through the second quantum dot layer into light having a wavelength in a third wavelength band.

According to some embodiments, the bonding member may fill the first additional opening.

According to some embodiments, the display apparatus may further include an overcoat layer covering the bank, the first quantum dot layer, the second quantum dot layer or the light-transmitting layer, and the second dummy quantum dot layer, the overcoat layer filling the first additional opening, and the bonding member contacts the overcoat layer.

According to some embodiments, the display apparatus may further include an overcoat layer covering the bank, the first quantum dot layer, the second quantum dot layer or the light-transmitting layer, and the second dummy quantum dot layer, and the bonding member may contact the overcoat layer and fill the first additional opening.

According to some embodiments, a distance from a center of the display area to a center of the first additional opening may be greater than a distance from the center of the display area to a center of the second additional opening.

According to some embodiments, the second additional opening is an innermost additional opening among additional openings with reference to a center of the display area, the first additional opening is an outermost additional opening among additional openings with reference to the center of the display area, and assuming that a distance from an inner side surface of the second additional opening in a direction to the display area to the inner side surface of the first additional opening in a direction away from the display area is a first distance and a distance from the inner side surface of the second additional opening in the direction to the display area to an outer edge of the bank is a second distance, a ratio of the first distance to the second distance may be greater than 12% and less than 80%.

According to some embodiments, the display apparatus may further include an overcoat layer covering the bank, the first quantum dot layer, and the second quantum dot layer or the light-transmitting layer, the overcoat layer filling the first additional opening and the second additional opening, and the bonding member may contact the overcoat layer.

According to some embodiments, the display apparatus may further include an overcoat layer covering the bank, the first quantum dot layer, and the second quantum dot layer or the light-transmitting layer, the overcoat layer filling the second additional opening, and the bonding member may contact the overcoat layer and fill the first additional opening.

According to some embodiments, a distance from a center of the display area to a center of the first additional opening may be greater than a distance from the center of the display area to a center of the second additional opening.

According to some embodiments, the display apparatus may further include a driving circuit unit over the first substrate to be located in the peripheral area, and the bank may overlap the driving circuit unit.

According to some embodiments, the bank may include a light-shielding material.

BRIEF DESCRIPTION OF THE DRAWINGS

The above and other aspects, features, and characteristics of certain embodiments of the disclosure will be more apparent from the following description taken in conjunction with the accompanying drawings, in which:

FIG. 7 is a schematic cross-sectional view of a portion of a display apparatus according to some embodiments;

FIG. 9 is a schematic cross-sectional view of a portion of a display apparatus according to some embodiments;

DETAILED DESCRIPTION

Figure 1:
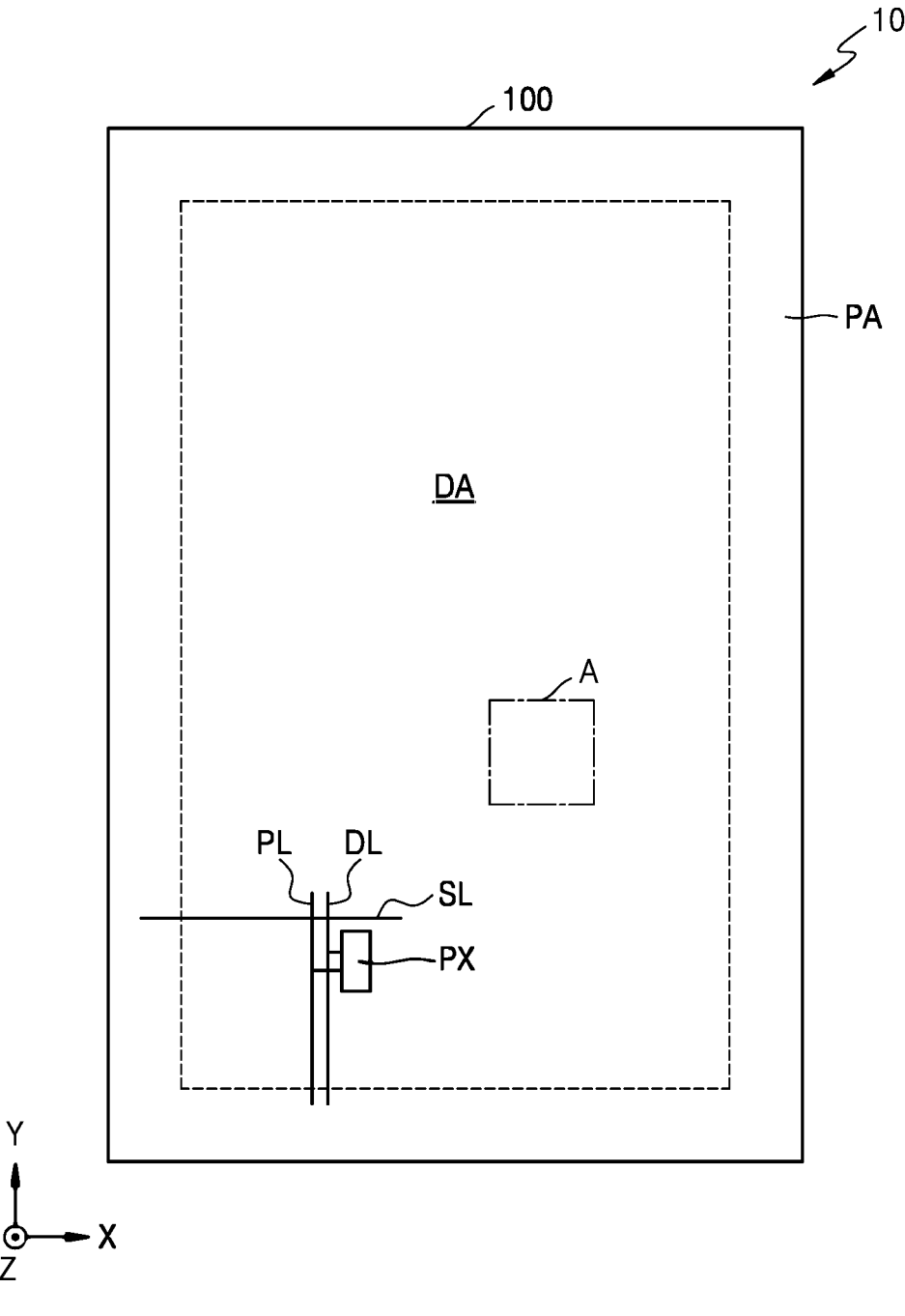
FIG. 1 is a schematic top-plan view of a portion of a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the embodiments allows for various modifications and numerous embodiments, particular embodiments will be illustrated in the drawings and described in detail in the written description. Effects, features, and methods of achieving the same will be clearly understood with reference to embodiments to be described in detail later in conjunction with the accompanying drawings. However, the embodiments may be embodied in many different forms and should not be construed as being limited to the embodiments set forth herein.

Hereinafter, the following embodiments will be described in detail with reference to the accompanying drawings, same reference numerals will be used for same or corresponding components, and repeated descriptions thereof will be omitted.

In the following embodiments, it will be understood that when a component such as a layer, a film, a region, or a plate is referred to as being "on" another component, the component may be directly on the other component or an intervening component may be present thereon. Sizes of components in the drawings may be exaggerated or reduced for convenience of description. For example, as sizes and thicknesses of components in the drawings are arbitrarily illustrated for convenience of description, the following embodiments are not limited thereto.

In the following embodiments, the X-axis, the Y axis, and the Z axis are not limited to three axes of the rectangular coordinate system, and may be interpreted in a broader sense. For example, the X-axis, the Y-axis, and the Z-axis may be perpendicular to one another, or may represent different directions that are not perpendicular to one another.

FIG. 1 is a schematic top-plan view of a portion of a display apparatus according to some embodiments. As shown in FIG. 1, the display apparatus according to some embodiments includes a display panel 10. The display apparatus may include any type of display apparatus including the display panel 10. For example, the display apparatus may include various apparatuses such as a smartphone, a tablet, a laptop computer, a television, a billboard, and the like.

The display panel 10 may include a display area DA and a peripheral area PA located outside the display area DA. FIG. 1 illustrates that the display area DA has a rectangular shape. However, the embodiments are not limited thereto. The display area DA may have various shapes, for example, a circle, an oval, a polygon, or other certain shapes.

The display area DA is an area configured to display images, and a plurality of pixels PX may be arranged therein. Each of the plurality of pixels PX may include a display device such as an organic light-emitting diode. Each of the plurality of pixels PX may emit red, green, or blue light. Each pixel PX may be connected to a pixel circuit including a thin-film transistor (TFT), a storage capacitor, and the like. The pixel circuit may be connected to a scan line SL configured to deliver scan signals, a data line DL crossing with the scan line SL and configured to deliver data signals, and a driving voltage line PL configured to supply a driving voltage. The scan line SL may extend in the X axis direction, and the data line DL and the driving voltage line PL may extend in the Y axis direction.

The pixels PX may emit light having a luminance corresponding to electric signals (e.g., data signals) from the corresponding pixel circuit to which the pixel PX is electrically connected. The display area DA may display certain images through light emitted from the pixel PX. For reference, as described above, the pixel PX may be defined as a light-emitting area emitting light having any one color from among red, green, and blue.

The peripheral area PA, in which the pixels PX are not arranged, may be an area that does not display images. Power source wiring to drive the pixels PX, or the like, may be arranged in the peripheral area PA. In addition, a printed circuit board including a driving circuit unit, or a terminal unit to which a driver integrated circuit is connected, may be arranged in the peripheral area PA. The driving circuit unit may also be arranged in the peripheral area PA.

As the display panel 10 includes a first substrate 100, it may be also described that the first substrate 100 has the display area DA and the peripheral area PA.

Figure 2:
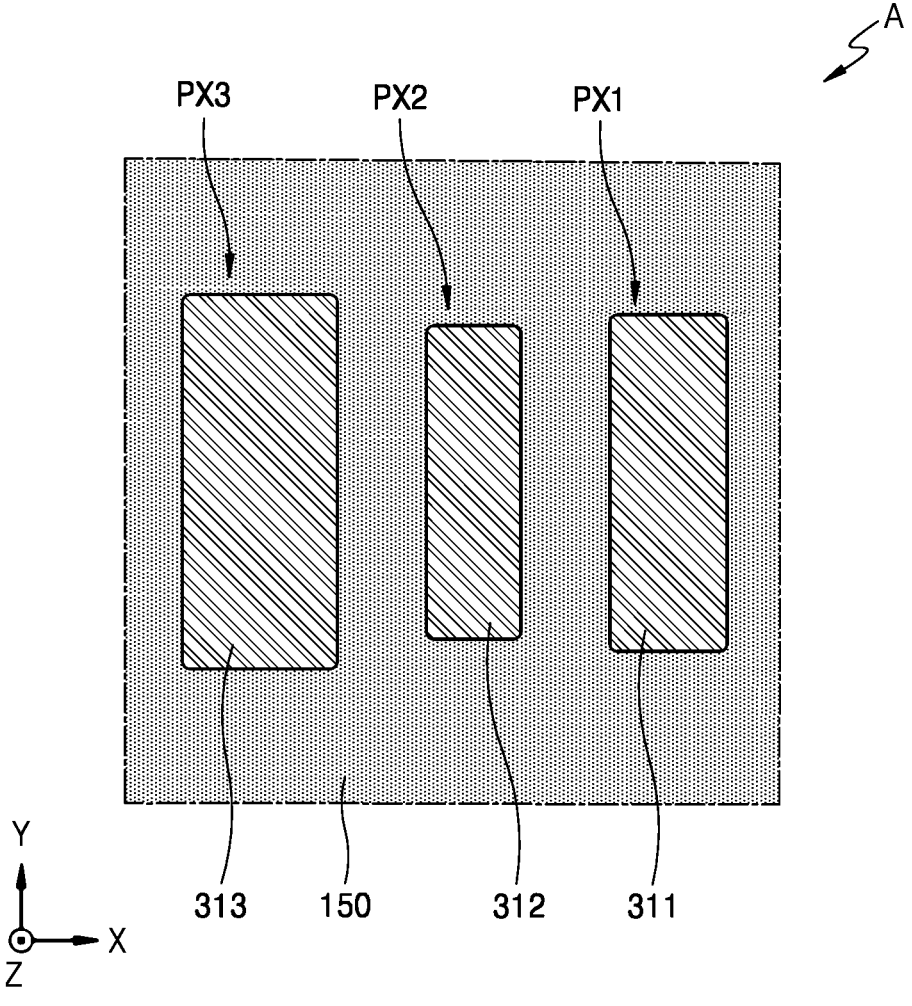
FIG. 2 is a schematic top-plan view of a portion of the display apparatus shown in FIG. 1.

FIG. 2 is a schematic top-plan view of a portion of the display panel 10 shown in FIG. 1. FIG. 2 is an enlarged top-plan view of portion A shown in FIG. 1.

As shown in FIG. 2, the display panel 10 may include a plurality of pixels, that is, a first pixel PX1, a second pixel PX2, and a third pixel PX3. The first pixel PX1, the second pixel PX2, and the third pixel PX3 may include the first pixel PX1, the second pixel PX2, and the third pixel PX3 emitting light of different colors, respectively. For example, the first pixel PX1 may emit red light, the second pixel PX2 may emit green light, and the third pixel PX3 may emit blue light.

Each of the first pixel PX1, the second pixel PX2, and the third pixel PX3 may have a polygon shape in a view from a direction (a Z axis direction) perpendicular or normal to the first substrate 100 (e.g., in a plan view). FIG. 2 illustrates that each of the first pixel PX1, the second pixel PX2, and the third pixel PX3 has a rectangular or square shape, for example, a rectangular or square shape with rounded corners, seen from the direction (the Z axis direction) perpendicular or normal to the first substrate 100 (e.g., in a plan view). However, the embodiments are not limited thereto. For example, each of the first pixel PX1, the second pixel PX2, and the third pixel PX3 may have a round or an elliptical shape in a view from the direction (the Z axis direction) perpendicular or normal to the first substrate 100 (e.g., in a plan view).

Sizes, that is, areas of the first pixel PX1, the second pixel PX2, and the third pixel PX3, may be different from one another. For example, the area of the second pixel PX2 may be less than the area of the first pixel PX1 and the area of the third pixel PX3. However, the embodiments are not limited thereto. For example, the areas of the first pixel PX1, the second pixel PX2, and the third pixel PX3 may be substantially equal to one another.

The first pixel PX1 may include a first pixel electrode 311, the second pixel PX2 may include a second pixel electrode 312, and the third pixel PX3 may include a third pixel electrode 313. A pixel defining layer 150 covers an edge of each of the first pixel electrode 311, the second pixel electrode 312, and the third pixel electrode 313. That is, the pixel defining layer 150 may define a first pixel opening 151 (see FIG. 3) to expose a center of the first pixel electrode 311, a second pixel opening 152 (see FIG. 3) to expose a center of the second pixel electrode 312, and a third pixel opening 153 (see FIG. 3) to expose a center of the third pixel electrode 313. The sizes of the first pixel PX1, the second pixel PX2, and the third pixel PX3 described above may indicate sizes of light-emitting areas of a display element implementing each pixel. The light-emitting area may be defined by pixel openings of the pixel defining layer 150.

The first pixel PX1, the second pixel PX2, and the third pixel PX3 may be arranged in a stripe arrangement type, as shown in FIG. 2. That is, the first pixel PX1, the second pixel PX2, and the third pixel PX3 may be sequentially arranged in the X axis direction. Alternatively, the pixels may also be arranged in a mosaic arrangement type.

However, the embodiments are not limited to the arrangement of the first pixel PX1, the second pixel PX2, and the third pixel PX3 in a stripe arrangement type. For example, the first pixel PX1, the second pixel PX2, and the third pixel PX3 may be arranged in a pentile arrangement type. In this case, the first pixel PX1 may be surrounded by the second pixels PX2 and the third pixels PX3, the second pixel PX2 may be surrounded by the first pixels PX1 and the third pixels PX3, and the third pixel PX3 may be surrounded by the first pixels PX1 and the second pixels PX2. Alternatively, the first pixel PX1, the second pixel PX2, and the third pixel PX may also be arranged in an S-stripe arrangement type. In this case, the second pixels PX2 may alternate with the third pixels PX3 in the Y axis direction, and pairs of the second pixels PX2 and the third pixels PX3 may alternate with the first pixels PX1 in the X axis direction.

Figure 3:
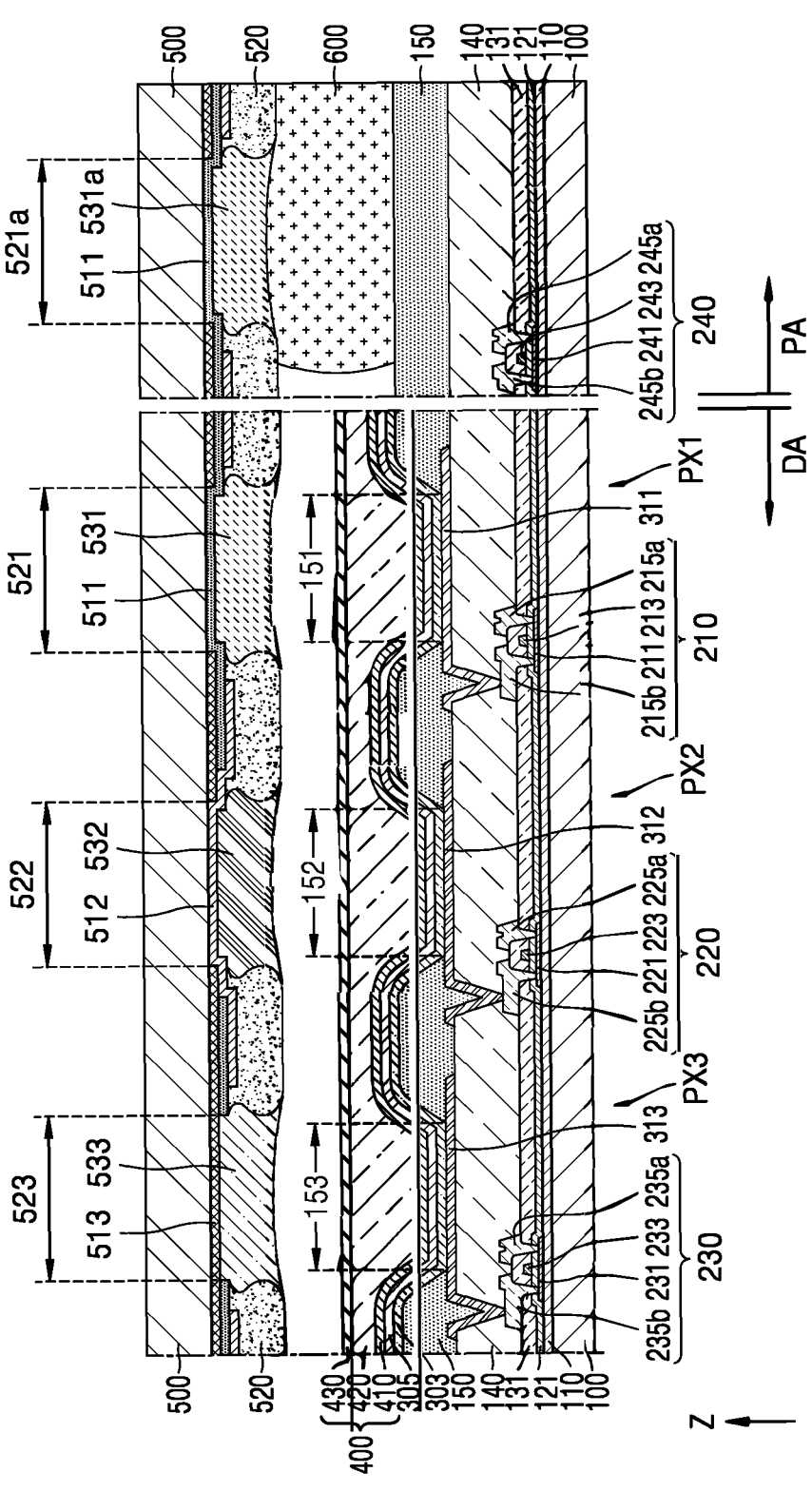
FIG. 3 is a schematic cross-sectional view of a portion of the display apparatus shown in FIG. 1.

FIG. 3 is a schematic cross-sectional view of a portion of the display apparatus shown in FIG. 1. FIG. 3 is a cross-sectional view of a portion of the display area DA and a portion of the peripheral area PA shown in FIG. 1. Although FIG. 3 illustrates that the first pixel PX1, the second pixel PX2, and the third pixel PX3 are sequentially placed, the embodiments are not limited thereto. For example, in a case where the first pixel PX1, the second pixel PX2, and the third pixel PX3 are arranged in a stripe arrangement type as shown in FIG. 2, the portion of the display area DA shown in FIG. 3 may include a cross-section taken along the X axis direction shown in FIGS. 1 and 2. However, in cases where the first pixel PX1, the second pixel PX2, and the third pixel PX3 are arranged in other arrangement types, the portion of the display area DA shown in FIG. 3 may include a cross-section taken along a curve or a broken line, not along a straight line.

The display apparatus according to some embodiments includes a first substrate 100, the first pixel electrode 311, the second pixel electrode 312, and the third pixel electrode 313 located over the first substrate 100, the pixel defining layer 150, an intermediate layer 303 including an emission layer, an opposite electrode 305, and an encapsulation layer 400. The display apparatus according to some embodiments also includes a second substrate 500 located over the first substrate 100 with the opposite electrode 305 located between the first substrate 100 and the second substrate 500, a bank 520, a first quantum dot layer 531, a second quantum dot layer 532, a first dummy quantum dot layer 531a, and a light-transmitting layer 533 arranged on a bottom surface of the second substrate 500 in a direction toward the first substrate 100. In addition, the display apparatus according to some embodiments also includes a bonding member 600 for bonding the first substrate 100 and the second substrate 500 to each other.

The first substrate 100 may include glass, metal, or polymer resin. The first substrate 100 may include a polymer resin, for example, polyethersulfone, polyacrylate, polyetherimide, polyethylene naphthalate, polyethylene terephthalate, polyphenylene sulfide, polyarylate, polyimide, polycarbonate, or cellulose acetate propionate. However, the first substrate 100 may be variously modified, for example, to have a multi-layer structure including two layers including the polymer resins stated above and a barrier layer between the two layers, the barrier layer including an inorganic material (silicon oxide, silicon nitride, silicon oxynitride, and the like).

In the display area DA, the first pixel electrode 311, the second pixel electrode 312, and the third pixel electrode 313 are located over the first substrate 100. In the display area DA, a first thin-film transistor 210, a second thin-film transistor 220, and a third thin-film transistor 230 electrically connected to the first pixel electrode 311, the second pixel electrode 312, and the third pixel electrode 313, respectively, may also be located over the first substrate 100, in addition to the first pixel electrode 311, the second pixel electrode 312, and the third pixel electrode 313. That is, as shown in FIG. 3, the first pixel electrode 311 may be electrically connected to the first thin-film transistor 210, the second pixel electrode 312 may be electrically connected to the second thin-film transistor 220, and the third pixel electrode 313 may be electrically connected to the third thin-film transistor 230. The first pixel electrode 311, the second pixel electrode 312, and the third pixel electrode 313 may be on a planarization layer 140, to be described in more detail later, which is located over the first substrate 100.

However, as shown in FIG. 3, in the peripheral area PA, a fourth thin-film transistor 240 included in the driving circuit unit may also be located over the first substrate 100. The driving circuit unit may include, for example, a gate driver configured to generate scan signals configured to be delivered to the display area DA through the scan line SL.

The first thin-film transistor 210 may include a first semiconductor layer 211, which includes amorphous silicon, polycrystalline silicon, an organic semiconductor material, or an oxide semiconductor material, a first gate electrode 213, a first source electrode 215a, and a first drain electrode 215b. The first gate electrode 213 may include various conductive materials and may have various layered structures, for example, may include a molybdenum (Mo) layer and an aluminum (Al) layer. In this case, the first gate electrode 213 may have a layered structure including Mo/Al/Mo. Alternatively, the first gate electrode 213 may include a titanium nitride ($TiN_x$) layer, an Al layer, and/or a titanium (Ti) layer. The first source electrode 215a and the first drain electrode 215b may also include various conductive materials and have various layered structures, for example, may include a Ti layer, an Al layer, and/or a copper (Cu) layer. In this case, the first source electrode 215a and the first drain electrode 215b may have a multi-layered structure including Ti/Al/Ti.

Although FIG. 3 illustrates that the first thin-film transistor 210 includes both of the first source electrode 215a and the first drain electrode 215, the embodiments are not limited thereto. For example, a source area of the first semiconductor layer 211 of the first thin-film transistor 210 may be integral with a drain area of a semiconductor layer of another thin-film transistor, and in this case, the first source electrode 215a of first thin-film transistor 210 may be omitted. The first source electrode 215a and/or the first drain electrode 215b may include a portion of a wiring.

To secure insulating property between the first semiconductor layer 211 and the first gate electrode 213, a gate insulating film 121 may be located between the first semiconductor layer 211 and the first gate electrode 213, the gate insulating film 121 including an inorganic material such as silicon oxide, silicon nitride, and/or silicon oxynitride. In addition, an interlayer insulating film 131 may be located on the first gate electrode 213, and the first source electrode 215a and the first drain electrode 215b may be located on the interlayer insulating film 131, the interlayer insulating film 131 including an inorganic material such as silicon oxide, silicon nitride, and/or silicon oxynitride. Such an insulating film including an inorganic material may be formed by chemical vapor deposition (CVD) or atomic layer deposition (ALD). The description above may be applied to embodiments and modifications to be described in more detail later.

A buffer layer 110 may be located between the first thin-film transistor 210 having the structure stated above and the first substrate 100, the buffer layer 110 including an inorganic material such as silicon oxide, silicon nitride, and/or silicon oxynitride. The buffer layer 110 may improve a planarization property of a top surface of the first substrate 100, or may prevent, reduce, or minimize permeation of impurities from the first substrate 100 and the like into the first semiconductor layer 211 of the first thin-film transistor 210.

The second thin-film transistor 220 in the second pixel PX2 may include a second semiconductor layer 221, a second gate electrode 223, a second source electrode 225a, and a second drain electrode 225b. The third thin-film transistor 230 in the third pixel PX3 may include a third semiconductor layer 231, a third gate electrode 233, a third source electrode 235a, and a third drain electrode 235b. The fourth thin-film transistor 240 in the peripheral area PA may include a fourth semiconductor layer 241, a fourth gate electrode 243, a fourth source electrode 245a, and a fourth drain electrode 245b. As structures of the second thin-film transistor 220, the third thin-film transistor 230, and the fourth thin-film transistor 240 are identical or similar to a structure of the first thin-film transistor 210 in the first pixel PX1, descriptions of the structures of the second thin-film transistor 220, the third thin-film transistor 230, and the fourth thin-film transistor 240 are omitted.

The planarization layer 140 may be located on the first thin-film transistor 210. For example, as shown in FIG. 3, when a light-emitting device including the first pixel electrode 311 is located over the first thin-film transistor 210, the planarization layer 140 covering the first thin-film transistor 210 may have a top surface that is generally flat, such that the first pixel electrode 311 of the light-emitting device may be located over the flat surface thereof. The planarization layer 140 may include an organic material such as acryl, benzocyclobutene (BCB), hexamethyldisiloxane (HMDSO), or the like. Although FIG. 3 illustrates the planarization layer 140 as a single layer, the planarization layer 140 may be variously modified, for example, into multiple layers.

A light-emitting device (e.g., an organic light-emitting device) may be in the first pixel PX1 as a display device. The organic light-emitting device includes the first pixel electrode 311, the opposite electrode 305, and the intermediate layer 303 located between the first pixel electrode 311 and the opposite electrode 305 and including the emission layer. As shown in FIG. 3, the first pixel electrode 311 may be electrically connected to the first thin-film transistor 210 by contacting any one of the first source electrode 215a and the first drain electrode 215b thereof through a contact hole formed in the planarization layer 140 and the like. The first pixel electrode 311 may include a light-transmitting conductive layer and a reflective layer, the light-transmitting conductive layer including, for example, indium tin oxide (ITO), indium oxide(In₂O₃), indium zinc oxide(IZO), or the like, and the reflective layer including a metal such as Al, silver(Ag), or the like. For example, the first pixel electrode 311 may have a three-layer structure including ITO/Ag/ITO.

An organic light-emitting device may be in the second pixel PX2. The organic light-emitting device may include the second pixel electrode 312, the opposite electrode 305, and the intermediate layer 303 located between the second pixel electrode 312 and the opposite electrode 305 and including the emission layer. An organic light-emitting device may be in the third pixel PX3. The organic light-emitting device may include the third pixel electrode 313, the opposite electrode 305, and the intermediate layer 303 located between the third pixel electrode 313 and the opposite electrode 305 and including the emission layer.

The second pixel electrode 312 is electrically connected to the second thin-film transistor 220 by contacting any one of the second source electrode 225a and the second drain electrode 225b thereof through a contact hole formed in the planarization layer 140 and the like. The third pixel electrode 313 is electrically connected to the third thin-film transistor 230 by contacting any one of the third source electrode 235a and the third drain electrode 235b thereof through a contact hole formed in the planarization layer 140 and the like. Description of the first pixel electrode 311 may be applied to the second pixel electrode 312 and the third pixel electrode 313.

According to some embodiments, the intermediate layer 303 including the emission layer may be located over the second pixel electrode 312 of the second pixel PX2 and the third pixel electrode 313 of the third pixel PX3, as well as the first pixel electrode 311 of the first pixel PX1. The intermediate layer 303 may have an integral shape over the first pixel electrode 311, the second pixel electrode 312, and the third pixel electrode 313. According to some embodiments, the intermediate layer 303 may be patterned and located on the first pixel electrode 311, the second pixel electrode 312, and the third pixel electrode 313. The intermediate layer 303 may include a hole injection layer, a hole transport layer, and/or an electron transport layer according to some embodiments, as well as the emission layer, and the above-mentioned layers included in the intermediate layer 303 may have an integral shape over the first pixel electrode 311, the second pixel electrode 312, and the third pixel electrode 313. Some of the layers included in the intermediate layer 303 may be patterned and located on the first pixel electrode 311, the second pixel electrode 312, and the third pixel electrode 313, according to some embodiments. The emission layer included in the intermediate layer 303 may emit light having a wavelength in a first wavelength band. The first wavelength band may be, for example, from about 450 nm to about 495 nm.

The opposite electrode 305 on the intermediate layer 303 may also have an integral shape over the first pixel electrode 311 to the third pixel electrode 313. The opposite electrode 305 may include a light-transmitting conductive layer formed of ITO, In₂O₃, or IZO, and may also include a semi-transmitting film including metals such as Al, lithium (Li), magnesium(Mg), ytterbium(Yb), or Ag. For example, the opposite electrode 305 may include a semi-transmitting film having a structure such as a MgAg layer, an AgYb layer, a Yb layer/MgAg layer or a Li layer/MgAg layer.

The pixel defining layer 150 may be located on the planarization layer 140. The pixel defining layer 150 defines openings corresponding to the pixels. That is, the pixel defining layer 150 covers an edge of each of the first pixel electrode 311, the second pixel electrode 312, and the third pixel electrode 313, and defines: the first pixel opening 151 exposing the center of the first pixel electrode 311; the second pixel opening 152 exposing the center of the second pixel electrode 312; and the third pixel opening 153 exposing the center of the third pixel electrode 313. As described above, the pixel defining layer 150 may define the pixels. In addition, as shown in FIG. 3, the pixel defining layer 150 may prevent or reduce instances of arcs and the like occurring at the edges of the first pixel electrode 311, the second pixel electrode 312, and the third pixel electrode 313 by increasing a distance between each of the edges of the first pixel electrode 311, the second pixel electrode 312, and the third pixel electrode 313 and the opposite electrode 305. The pixel defining layer 150 may include an organic material such as polyimide or HMDSO.

The organic light-emitting devices, which include the first pixel electrode 311, the second pixel electrode 312, the third pixel electrode 313, and the intermediate layer 303 including the emission layer, may be easily degraded by moisture or oxygen. Accordingly, to protect the organic light-emitting devices from external moisture or oxygen, the display apparatus may include the encapsulation layer 400 covering the organic light-emitting devices.

The encapsulation layer 400 may include at least one inorganic encapsulation layer and at least one organic encapsulation layer. For example, the encapsulation layer 400 may include a first inorganic encapsulation layer 410, a second inorganic encapsulation layer 430, and an organic encapsulation layer 420 between the first inorganic encapsulation layer 410 and the second inorganic encapsulation layer 430.

The first inorganic encapsulation layer 410 and the second inorganic encapsulation layer 430 may include at least one inorganic insulating material such as $SiO_2$, $SiN_x$, $SiO_xN_y$, $Al_2O_3$, titanium oxide ($TiO_2$), tantalum oxide ($Ta_2O_5$), hafnium oxide ($HfO_2$), or zinc oxide ($ZnO$ or $ZnO_2$), and may be formed by CVD and the like. The organic encapsulation layer 420 may include a polymer-based material. The polymer-based material may include a silicon-based resin, an acryl-based resin (for example, polymethylmethacrylate, polyacrylate, and the like), an epoxy-based resin, polyimide, polyethylene, and the like.

The first inorganic encapsulation layer 410 formed by CVD generally has a uniform thickness, even though a top surface of the first inorganic encapsulation layer 410 is uneven, as shown in FIG. 3. However, a top surface of the organic encapsulation layer 420 is generally even, and therefore, a top surface of the second inorganic encapsulation layer 430 on the organic encapsulation layer 420 may generally have an even shape.

The second substrate 500 is located over the first substrate 100 with the opposite electrode 305 located between the first substrate 100 and the second substrate 500. The second substrate 500 may include glass, metals, or polymer resin. The second substrate 500 may include a polymer resin, for example, polyethersulfone, polyacrylate, polyetherimide, polyethylene naphthalate, polyethylene terephthalate, polyphenylene sulfide, polyarylate, polyimide, polycarbonate, or cellulose acetate propionate. However, the second substrate 500 may be variously modified, for example, to have a multi-layer structure including two layers including the polymer resins stated above and a barrier layer between the two layers, the barrier layer including an inorganic material (silicon oxide, silicon nitride, silicon oxynitride, and the like).

The bank 520 is located over a bottom surface of the second substrate 500 in a direction toward the first substrate 100 (the −Z axis direction). The bank 520 defines: a first opening 521, which overlaps the first pixel opening 151 exposing the first pixel electrode 311 of the pixel defining layer 150; a second opening 522, which overlaps the second pixel opening 152 exposing the second pixel electrode 312 of the pixel defining layer 150; and a third opening 523, which overlaps the third pixel opening 153 exposing the third pixel electrode 313 of the pixel defining layer 150. That is, in a view from the direction (the Z axis direction) perpendicular or normal to the first substrate 100 (e.g., in a plan view), the first opening 521 of the bank 520 overlaps the first pixel opening 151, the second opening 522 of the bank 520 overlaps the second pixel opening 152, and the third opening 523 of the bank 520 overlaps the third pixel opening 153. Accordingly, in a view from the direction (the Z axis direction) perpendicular or normal to the first substrate 100 (e.g., in a plan view), a shape of each of edges of the first opening 521 to the third opening 523 of the bank 520 may be identical or similar to a shape of an edge of a corresponding pixel opening from among the first pixel opening 151 to the third pixel opening 153 of the pixel defining layer 150. As described above, the first opening 521 of the bank 520 corresponds to the first pixel electrode 311, the second opening 522 of the bank 520 corresponds to the second pixel electrode 312, and the third opening 523 of the bank 520 corresponds to the third pixel electrode 313.

The bank 520 also defines a first additional opening 521a, as shown in FIG. 3. The first additional opening 521a defined in the bank 520 is in the peripheral area PA. Being located in the peripheral area PA, in a view from the direction (the Z axis direction) perpendicular to the first substrate 100, the first additional opening 521a does not overlap the pixel electrodes and the like.

The bank 520 may include various materials, and may include a photoresist material. Accordingly, the bank 520 may be easily formed by processes such as exposure and development.

The first quantum dot layer 531 may be in the first opening 521 defined in the bank 520. In a view from the direction (the Z axis direction) perpendicular to the first substrate 100, the first quantum dot layer 531 may overlap the first pixel electrode 311. The first quantum dot layer 531 may convert light having a wavelength in a first wavelength band, the light passing through the first quantum dot layer 531, into light having a wavelength in a second wavelength band. The second wavelength band may be, for example, from about 625 nm to about 780 nm. However, the embodiments are not limited thereto, and a wavelength band to which the wavelength to be converted by the first quantum dot layer 531 belongs and a wavelength band to which the wavelength after the conversion belongs may be differently modified.

The first quantum dot layer 531 may have a form in which quantum dots are dispersed in a resin. According to some embodiments, a quantum dot indicates a crystal of a semiconductor compound, and may include an arbitrary material, from which light having various emission wavelengths may be emitted according to a size of the crystal. A diameter of the quantum dot may be from about 1 nm to about 10 nm.

The quantum dots may be synthesized through a wet chemical process, an organic material chemical deposition process, a molecule line epitaxy process, or processes similar thereto. The wet chemical process is a method of growing quantum particle crystals after mixing an organic solvent with a precursor material. In the wet chemical process, when the crystal grows, the organic solvent naturally functions as a dispersant coordinated on a surface of a quantum dot crystal and adjusts the growth of the crystal, and thus, it is easier to perform the wet chemical process than a vapor deposition method such as metal organic chemical vapor deposition (MOCVD) or molecular beam epitaxy (MBE). In addition, despite being a low-cost process, the growth of the quantum dot particles may be controlled by the wet chemical process.

The quantum dot may include a Group II-VI semiconductor compound, a Group III-V semiconductor compound, a Group III-VI semiconductor compound, a Group I-III-VI semiconductor compound, a Group IV-VI semiconductor material, a Group IV element or compound, or any suitable combination thereof.

The Group II-VI semiconductor compound may include, for example, a binary compound such as CdS, CdSe, CdTe, ZnS, ZnSe, ZnTe, ZnO, HgS, HgSe, HgTe, MgSe, MgS, or the like, a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, or HgZnTe, a quaternary compound such as CdZnSeS, CdZnSeTe, CdZnSTe, CdHgSeS, CdHgSeTe, CdHgSTe, HgZnSeS, HgZnSeTe, or HgZnSTe, or any suitable combination thereof.

The Group III-V semiconductor compound may include, a binary compound such as GaN, GaP, GaAs, GaSb, AlN, AlP, AlAs, AlSb, InN, InP, InAs, InSb, or the like, a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or the like, a quaternary compound such as GaAlNP, GaAlNAs, GaAlNSb, GaAlPAs, GaAlPSb, GaInNP, GaInNAS, GaInNSb, GaInPAs, GaInPSb, InAlNP, InAlNAs, InAlNSb, InAlPAs, InAlPSb, or any suitable combination thereof. The Group III-V semiconductor compound may further include a Group II element. The Group III-V semiconductor compound further including the Group II element may include, for example, InZnP, InGaZnP, InAlZnP, or the like.

The Group III-VI semiconductor compound may include, for example, a binary compound such as GaS, GaSe, $Ga_2Se_3$, GaTe, InS, $In_2Se$, InSe, $In_2Se_3$, InTe, or the like, a ternary compound such as AgInS, $AgInS_2$, CuInS, $CuInS_2$, $InGaS_3$, $InGaSe_3$, or the like, or any suitable combination thereof.

The Group I-III-IV semiconductor compound may include, for example, a ternary compound such as AgInS, $AgInS_2$, CuInS, $CuInS_2$, $CuGaO_2$, $AgGaO_2$, $AgAlO_2$, or the like, or any suitable combination thereof.

The Group IV-VI semiconductor compound may include, for example, a binary compound such as SnS, SnSe, SnTe, PbS, PbSe, PbTe, or the like, a ternary compound such as SnSeS, SnSeTe, SnSTe, PbSeS, PbSeTe, PbSTe, SnPbS, SnPbSe, SnPbTe, or the like, a quaternary compound such as SnPbSSe, SnPbSeTe, SnPbSTe, or the like, or any suitable combination thereof.

The Group IV element or compound may include a single-element compound such as Si, Ge, or the like, a binary compound such as SiC, SiGe, or the like, or any suitable combination thereof.

Elements included in a multi-element compound such as a binary compound, a ternary compound, and a quaternary compound may be in particles in a uniform or non-uniform concentration.

Quantum dots may have a single structure, in which the elements included in the corresponding quantum dots are identical to one another, or a dual structure, that is, a core-shell structure. For example, a material included in a core may be different from a material included in a shell. The shell of the quantum dot may function as a protective layer to maintain semiconductor properties by preventing or reducing chemical modification of the core and/or a charging layer to grant electrophoretic properties to the quantum dot. The shell may include a single layer or multiple layers. An interface between the core and the shell may have a concentration gradient in which the concentration of an element in the shell decreases toward the center of the shell.

The shell of the quantum dot may include, for example, a metal oxide or a non-metal oxide, a semiconductor compound, or a combination thereof. The metal oxide or non-metal oxide may include, for example, a binary compound such as $SiO_2$, $Al_2O_3$, $TiO_2$, ZnO, $ZnO_2$, MnO, $Mn_2O_3$, $Mn_3O_4$, CuO, FeO, $Fe_2O_3$, $Fe_3O_4$, CoO, $Co_3O_4$, NiO, or the like, a ternary compound such as $MgAl_2O_4$, $CoFe_2O_4$, $NiFe_2O_4$, $CoMn_2O_4$, or the like, or any suitable combination thereof. The semiconductor compound may include, for example, the Group II-VI semiconductor compound, the Group III-V semiconductor compound, the Group III-VI semiconductor compound, the Group I-III-VI semiconductor compound, the Group IV-VI semiconductor compound, or any suitable combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any suitable combination thereof.

The quantum dot may have a full width of half maximum (FWHM) of an emission wavelength spectrum of about 45 nm or less, for example, 40 nm or less, or for example, 30 nm or less, and may improve color purity or a color gamut. In addition, light emitted from the quantum dot is emitted in all directions, and therefore, a viewing angle of the light may be improved.

In addition, a shape of the quantum dot may include, for example, a sphere shape, a pyramid shape, a multi-arm shape, a cubic shape shape, a nanoparticle shape, a nanotube shape, a nanowire shape, a nanofiber shape, or a nano plate shape.

As an energy band gap may be adjusted by adjusting the size of the quantum dot, light in various wavelength bands may be obtained in a quantum dot emission layer. Accordingly, a light-emitting device emitting light in various wavelengths may be implemented by using quantum dots having different sizes. In detail, the size of the quantum dot may be selected to emit red, green, and/or blue light. In addition, the sizes of the quantum dots may be configured such that white light is emitted through a combination of light having different colors.

The first quantum dot layer 531 may include a scatterer. By having incident light scattered by the scatterer included in the first quantum dot layer 531, the incident light may be effectively converted by the quantum dot in the first quantum dot layer 531. The scatterer may include any material, by which transmitted light may be partially scattered by forming an optical interface between the scatterer and a light-transmitting resin, and may include, for example, metal oxide particles or organic particles. A metal oxide for the scatterer may include titanium oxide ($TiO_2$), zirconium oxide ($ZrO_2$), aluminum oxide ($Al_2O_3$), indium oxide ($In_2O_3$), zinc oxide (ZnO or $ZnO_2$), tin oxide ($SnO_2$), or the like, and an organic material for the scatter may include an acryl-based resin or a urethane-based resin. The scatterer may scatter the light in various directions regardless of an incident angle of the light, without substantially converting a wavelength of the incident light. By doing so, the scatterer may improve lateral visibility of the display apparatus. In addition, the scatterer included in the first quantum dot layer 531 may improve light conversion efficiency by increasing the probability that the incident light incident to the first quantum dot layer 531 meets the quantum dots.

The resin included in the first quantum dot layer 531 may include any material that has an extraordinary scattering property to the scatterer and light transmittance. For example, a polymer resin such as an acryl-based resin, an amide-based resin, an epoxy-based resin, BCB, or HMDSO may be used as the material for forming the first quantum dot layer 531. The material for forming the first quantum dot layer 531 including the resin and the scatterer may be located, through an inkjet printing method, in the first opening 521 defined in the bank 520 to overlap the first pixel electrode 311.

The second quantum dot layer 532 may be in the second opening 522 of the bank 520. In a view from the direction (the Z axis direction) perpendicular to the first substrate 100, the second quantum dot layer 532 may overlap the second pixel electrode 312.

The second quantum dot layer 532 may convert light having the wavelength in the first wavelength band, the light passing through the second quantum dot layer 532, into light having a wavelength in a third wavelength band. The third wavelength band may be, for example, from about 495 nm to about 570 nm. However, the embodiments are not limited thereto, and a wavelength band to which the wavelength to be converted by the second quantum dot layer 532 belongs and a wavelength band to which the wavelength after the conversion belongs may be differently modified.

The second quantum dot layer 532 may have a form in which quantum dots are dispersed in a resin. According to some embodiments, the following embodiments, and modifications thereof, a quantum dot indicates a crystal of a semiconductor compound, and may include any suitable material, from which light having various emission wavelengths may be emitted according to a size of the crystal. A diameter of the quantum dot may be from about 1 nm to about 10 nm. As descriptions of the quantum dots included in the first quantum dot layer 531 described above may be applied to the quantum dots included in the second quantum dot layer 532, descriptions of the quantum dots included in the second quantum dot layer 532 are omitted.

The second quantum dot layer 532 may include a scatterer. By having incident light scattered by the scatterer included in the second quantum dot layer 532, the incident light may be effectively converted by the quantum dots in the second quantum dot layer 532. The scatterer may include any material, by which transmitted light is partially scattered by forming an optical interface between the scatterer and a light-transmitting resin, and may include, for example, metal oxide particles or organic particles. The metal oxide for the scatterer or the organic material for the scatterer is as described above. The scatterer may scatter the light in various directions regardless of an incident angle of the light, without substantially converting a wavelength of the incident light. By doing so, the scatterer may improve the lateral visibility of the display apparatus. In addition, the scatterer included in the second quantum dot layer 532 may improve light conversion efficiency by increasing the probability that the incident light incident to the second quantum dot layer 532 meets the quantum dots.

The resin included in the second quantum dot layer 532 may include any material that has extraordinary scattering properties to the scatterer and light transmittance. For example, a polymer resin such as an acryl-based resin, an amide-based resin, an epoxy-based resin, BCB, or HMDSO may be used as the material for forming the second quantum dot layer 532. The material for forming the second quantum dot layer 532 including the resin and the scatterer may be located, through the inkjet printing method, in the second opening 522 of the bank 520 to overlap the second pixel electrode 312.

The light-transmitting layer 533 transmits light having a wavelength in the first wavelength band, which is generated by the intermediate layer 303 including the emission layer in the third pixel PX3, through the encapsulation layer 400 without wavelength conversion and discharges the light to the outside. Accordingly, the light-transmitting layer 533 including a light-transmitting resin may be in the third opening 523 of the bank 520 overlapping with the third pixel electrode 313. However, in some cases, unlike shown in FIG. 3, the light-transmitting layer 533 may not be in the third opening 523 of the bank 520. The light-transmitting layer 533 may include the light-transmitting resin and the scatterer.

The scatterer included in the light-transmitting layer 533 may include any material, by which transmitted light is partially scattered by forming an optical interface between the scatterer and the light-transmitting resin, and may include, for example, a metal oxide or organic particles. The metal oxide for the scatterer or the organic material for the scatterer is as described above. The scatterer may scatter the light in various directions regardless of an incident angle of the light, without substantially converting a wavelength of the incident light. By doing so, the scatterer may improve the lateral visibility of the display apparatus.

The light-transmitting resin included in the light-transmitting layer 533 may include any material that has extraordinary scattering properties to the scatterer and light transmittance. For example, a polymer resin such as an acryl-based resin, an amide-based resin, an epoxy-based resin, BCB, or HMDSO may be used as the light-transmitting resin included in the light-transmitting layer 533. The material for forming the light-transmitting layer 533 that is a combination of the light-transmitting resin and the scatterer may be, through the inkjet printing method, in the third opening 523 of the bank 520 to overlap the third pixel electrode 313.

The first dummy quantum dot layer 531a may be in the first additional opening 521a of the bank 520. The first dummy quantum dot layer 531a may include a same material as the first quantum dot layer 531. The material for forming the first dummy quantum dot layer 531a may be, through the inkjet printing method, in the first additional opening 521a of the bank 520.

Color filter layers may be located between the first quantum dot layer 531, the second quantum dot layer 532, the light-transmitting layer 533, and the second substrate 500. The color filter layers may also be located between the first dummy quantum dot layer 531a and the second substrate 500.

A first color filter layer 511 may be on the first quantum dot layer 531, a second color filter layer 512 may be on the second quantum dot layer 532, and a third color filter layer 513 may be on the light-transmitting layer 533. The first color filter layer 511 may also be located on the first dummy quantum dot layer 531a if needed.

The first color filter layer 511 may only transmit light having a wavelength of about 625 nm to about 780 nm. The second color filter layer 512 may only transmit light having a wavelength of about 495 nm to about 570 nm. The third color filter layer 513 may only transmit light having a wavelength of about 450 nm to about 495 nm. The first color filter layer 511 to the third color filter layer 513 may improve color purity of light emitted to the outside to improve the quality of displayed images. In addition, the first color filter layer 511 to the third color filter layer 513 may reduce reflection of external light by reducing a ratio at which the external light incident to the display apparatus is reflected by the first pixel electrode 311 to the third pixel electrode 313 and then emitted to the outside. A black matrix may be located among the first color filter layer 511 to the third color filter layer 513.

The third color filter layer 513 defines an opening corresponding to the first quantum dot layer 531, as shown in FIG. 3. The opening of the third color filter layer 513 may define an area of the first pixel PX1. The first color filter layer 511 at least fills an opening of the third color filter layer 513. The third color filter layer 513 may define an opening corresponding to the first dummy quantum dot layer 531a, as shown in FIG. 3. In this case, according to some embodiments, the first color filter layer 511 at least fills the opening of the third color filter layer 513.

In addition, the third color filter layer 513 defines an opening corresponding to the second quantum dot layer 532, as shown in FIG. 3. The opening of the third color filter layer

513 may define an area of the second pixel PX2. The second color filter layer 512 at least fills the opening of the third color filter layer 513.

The first color filter layer 511 defines an opening corresponding to the light-transmitting layer 533. The opening of the first color filter layer 511 may define an area of the third pixel PX3. The third color filter layer 513 at least fills the opening of the first color filter layer 511. The first color filter layer 511 also defines an opening corresponding to the second quantum dot layer 532, and the second color filter layer 512 fills the opening of the first color filter layer 511.

A portion in which two or more color filters overlap may function as a black matrix. This is because, for example, when only light having a wavelength of about 625 nm to about 780 nm is transmitted through the first color filter layer 511 and only light having a wavelength of about 450 nm to about 495 nm is transmitted through the third color filter layer 513, in a portion in which the first color filter layer 511 and the third color filter layer 513 overlap each other, there is theoretically no light that may transmit through both the first color filter layer 511 and the third color filter layer 513. When there is a portion in which all of the first color filter layer 511, the second color filter layer 512, and the third color filter layer 513 overlap one another among the first pixel PX1, the second pixel PX2, and the third pixel PX3, color filters may function as black matrixes among the first pixel PX1, the second pixel PX2, and the third pixel PX3. In addition, a portion in which the first color filter layer 511, the second color filter layer 512, and the third color filter layer 513 overlap one another may be between the bank 520 and the second substrate 500 in the peripheral area PA.

The bonding member 600 is between the first substrate 100 and the second substrate 500, and binds the first substrate 100 and the second substrate 500 to each other. Here, that the bonding member 600 binds the first substrate 100 and the second substrate 500 does not only indicate that the bonding member 600 directly contacts each of the first substrate 100 and the second substrate 500. For example, as shown in FIG. 3, the bonding member 600 may bind the first substrate 100 and the second substrate 500 to each other by contacting the pixel defining layer 150 over the first substrate 100 and the bank 520 over the second substrate 500. The bonding member 600 may be in the peripheral area PA, and may overlap the first additional opening 521a of the bank 520. The bonding member 600 may include a sealing member, for example, a sealant.

Figure 4:
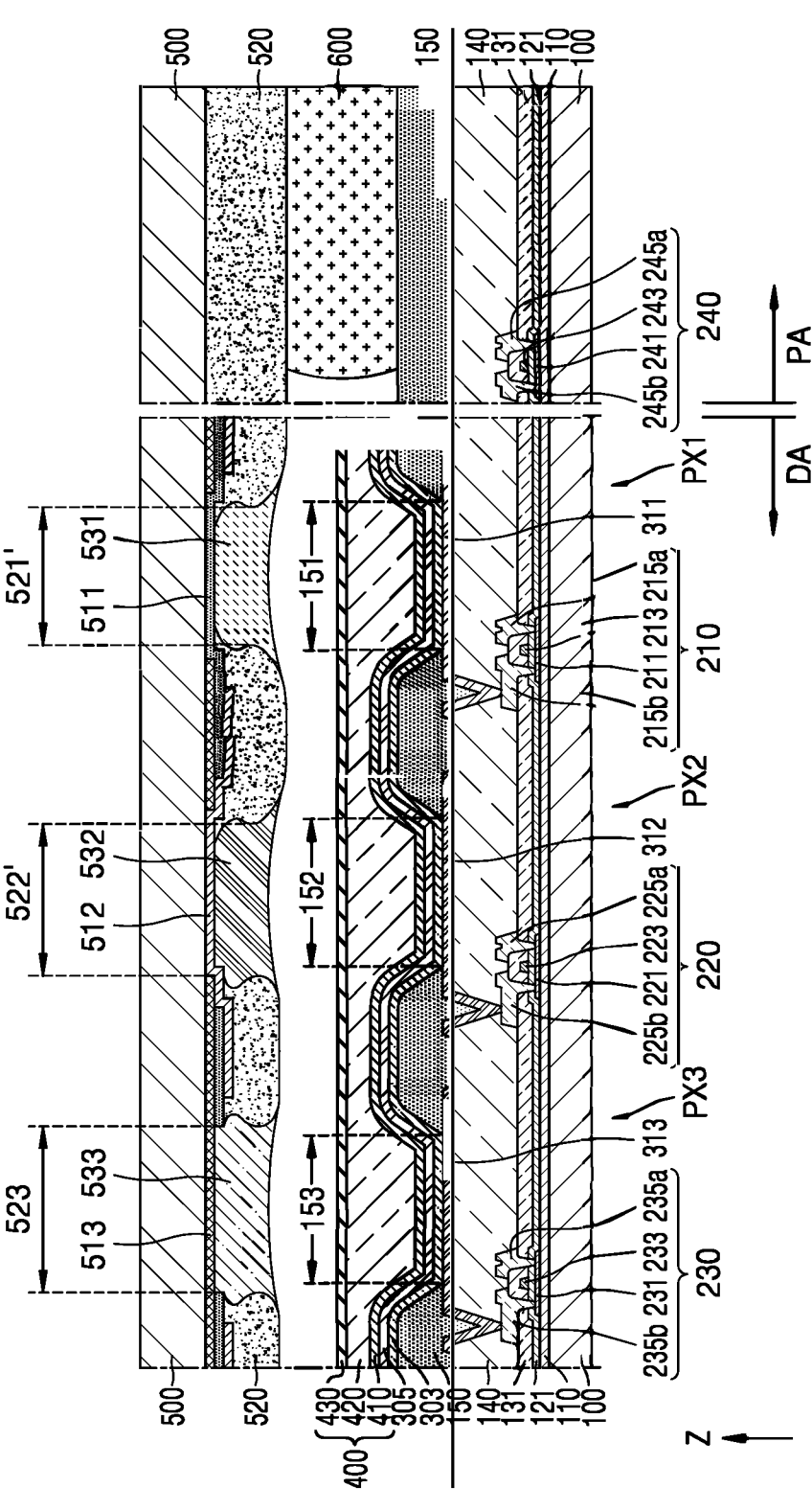
FIG. 4 is a schematic cross-sectional view of a portion of a display apparatus in some comparative examples.

FIG. 4 is a schematic cross-sectional view of a portion of a display apparatus according to some examples (e.g., a comparative example). As shown in FIG. 4, when the bank 520 does not have the first additional opening 521a described above in the peripheral area PA, an opening of the bank 520 in a portion of the display area DA that is adjacent to the peripheral area PA may be formed in a size smaller than a preset size. For example, after forming an temporary layer by using a material including photoresist for forming the bank 520 to correspond to the entire surface of the second substrate 500, portions of the temporary layer except portions to form the openings are exposed and cured, and by doing so, a first opening 521', a second opening 522', and a third opening 523 of the bank 520 may be formed.

Here, as shown in FIG. 4, when the openings are not formed in the bank 520 in the peripheral area PA, a wide portion corresponding to the peripheral area PA among the portions of the temporary layer for forming the bank 520 is cured by exposure. In this process, a first portion, which is to be exposed as a portion adjacent to the peripheral area PA in the portions in the display area DA of the temporary layer, is directly or indirectly affected by the exposure performed on the wide portion included in the peripheral area PA. As a result, the first portion may be exposed to a relatively high degree than a second portion that is exposed as a portion in a center of the display area DA.

Accordingly, as shown in FIG. 4, in the case of an opening relatively adjacent to the peripheral area PA among the openings of the bank 520 in the display area DA, in a view from the direction (the Z axis direction) perpendicular to the second substrate 500, an area of the opening may be smaller than areas of other openings. In addition, a portion of the bank 520 to define an opening that is relatively adjacent to the peripheral area PA from among the bank 520 in the display area DA may have a height greater than a height of the portion of the bank 520 in the center of the display area DA. FIG. 4 illustrates that an area of each of the first opening 521' and the second opening 522' of the bank 520 is less than an area of the third opening 523.

As the first quantum dot layer 531 is in the first opening 521', in a view from the direction (the Z axis direction) perpendicular to the second substrate 500, an area of the first quantum dot layer 531 in the first opening 521' is less than an area of the first quantum dot layer 531 in the center of the display area DA. In addition, a thickness of the first quantum dot layer 531 in the first opening 521' is greater than a thickness of the first quantum dot layer 531 in the center of the display area DA.

Accordingly, even when a same electrical signal is applied to a pixel corresponding to the first quantum dot layer 531 in the first opening 521' and a pixel corresponding to the first quantum dot layer 531 in the center of the display area DA, color coordinates and/or amounts of light emitted from the two pixels may be different from each other. As a result, the quality of image implemented by the display apparatus is degraded.

However, in the display apparatus according to some embodiments, as shown in FIG. 3, the bank 520 defines the first additional opening 521a in the peripheral area PA. Accordingly, instead of all or most of the portions in the peripheral area PA from among the portions in the temporary layer for forming the bank 520, only some of the portions are exposed. Therefore, in the exposure process, excessive exposure of the first portion, which is the portion adjacent to the peripheral area PA in the temporary layer, may be efficiently prevented or reduced as much as possible. As a result, a width or height of the portion adjacent to the peripheral area PA from among the portions of the bank 520 in the display area DA may be identical or similar to a width or height of the portion adjacent to the center of the display area DA.

In the display apparatus according to some embodiments, when a same electrical signal is applied to the pixel corresponding to the first quantum dot layer 531 in the first opening 521 adjacent to the peripheral area PA and a pixel corresponding to the first quantum dot layer 531 in the center of the display area DA, color coordinates and/or amounts of light emitted from the two pixels may be identical or similar to each other. Accordingly, a display apparatus configured to display high-quality images may be implemented.

As described above, in the peripheral area PA, the fourth thin-film transistor 240 included in the driving circuit unit may also be located over the first substrate 100. The driving circuit unit may include, for example, a gate driver configured to generate scan signals to be provided to the display area DA through the scan line SL. The bank 520 may overlap the driving circuit unit. In detail, in a view from the direction (the Z axis direction) perpendicular or normal to the second substrate 500 (e.g., in a plan view), the bank 520 may overlap the driving circuit unit. FIG. 3 illustrates that the bank 520 overlaps the fourth thin-film transistor 240 in a view from the direction (the Z axis direction) perpendicular or normal to the second substrate 500 (e.g., in a plan view).

The fourth thin-film transistor 240 may be sensitive to the external light or may be damaged by the external light. For example, the fourth semiconductor layer 241 of the fourth thin-film transistor 240 may include an oxide semiconductor material. In this case, the oxide semiconductor material may malfunction due to the external light. However, in the display apparatus according to some embodiments, the bank 520 defining the first additional opening 521a overlaps the fourth thin-film transistor 240.

That is, in the display apparatus according to some embodiments, the first additional opening 521a of the bank 520 does not overlap the fourth thin-film transistor 240. By doing so, it is possible to effectively prevent, reduce, or minimize the external light, which is incident on the second substrate 500 from the outside of the second substrate 500, from reaching the fourth thin-film transistor 240.

To do so, the bank 520 may include a light-shielding material such as a black matrix material, a red dye, a violet dye, or a blue dye. Alternatively, the reflectivity on the surface of the bank 520 may be improved by having the bank 520 include $TiO_2$ or a metal oxide, and by doing so, it may be possible to effectively prevent, reduce, or minimize the external light, which is incident to the second substrate 500 from the outside of the second substrate 500, from reaching the fourth thin-film transistor 240. The descriptions will be applied to embodiments and modifications to be described in more detail later.

Although FIG. 3 illustrates that the fourth thin-film transistor 240 is in the bank 520, not at an outermost portion of the bank 520, the embodiments are not limited thereto. For example, the driving circuit unit may also include a thin-film transistor located at the outermost portion of the bank 520.

According to some embodiments, a filler may be in a space between the first substrate 100 and the second substrate 500. For example, a space among the first quantum dot layer 531, the second quantum dot layer 532, the light-transmitting layer 533, the bank 520 and the encapsulation layer 400 may be filled with the filler. Such a filler may include a resin like acryl or epoxy.

Figure 5:
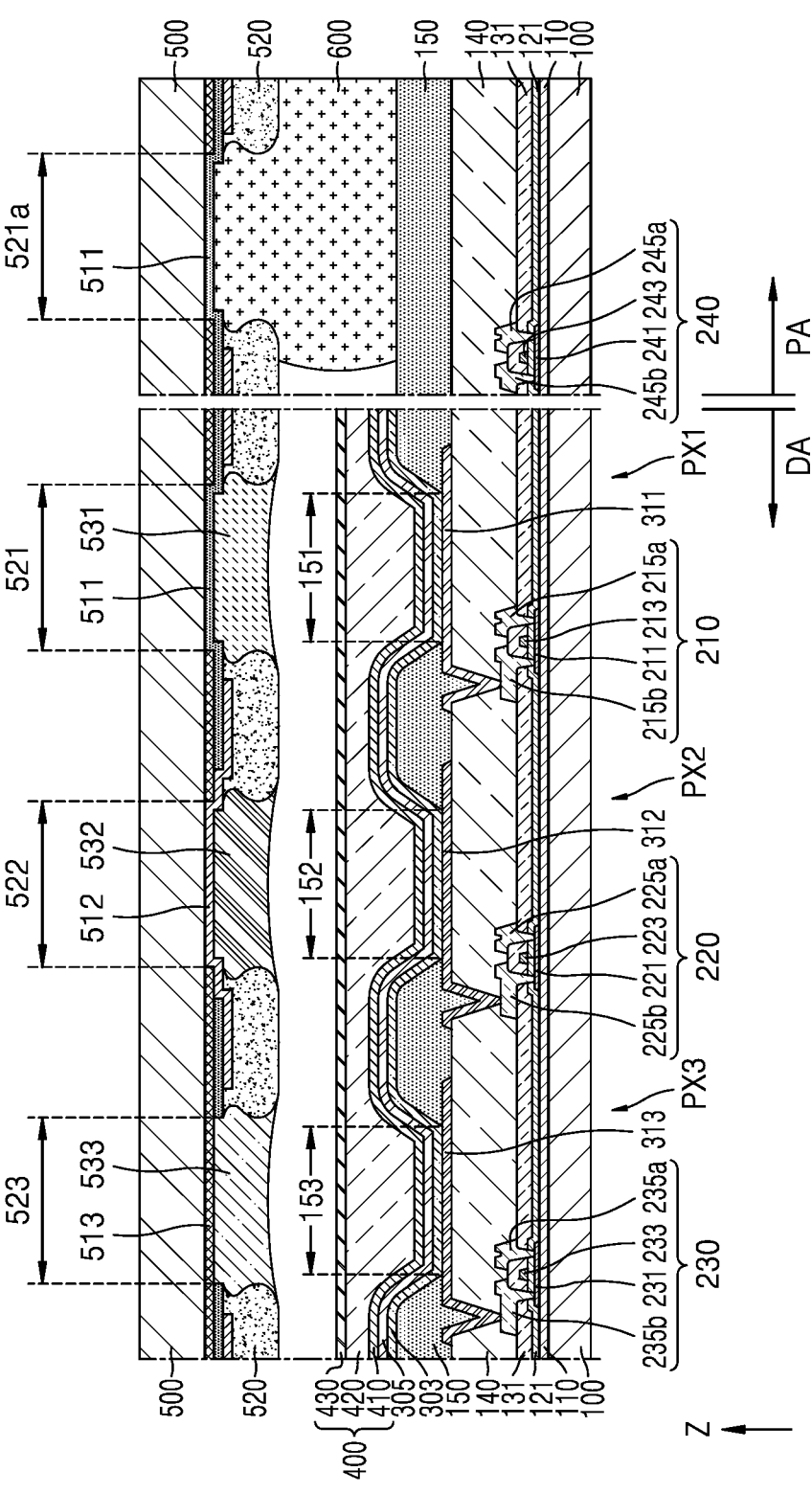
FIG. 5 is a schematic cross-sectional view of a portion of a display apparatus according to some embodiments.

FIG. 5 is a schematic cross-sectional view of a portion of a display apparatus according to some embodiments. As shown in FIG. 5, the display apparatus according to some embodiments are different from the display apparatus described with reference to FIG. 3 in that the display apparatus according to some embodiments do not include the first dummy quantum dot layer 531a. As described above, a display apparatus which displays high-quality images may be implemented by having the bank 520 define the first additional opening 521a in the peripheral area PA even when the display apparatus does not include the first dummy quantum dot layer 531a. In this case, the bonding member 600 may fill the first additional opening 521a of the bank 520.

Figure 6:
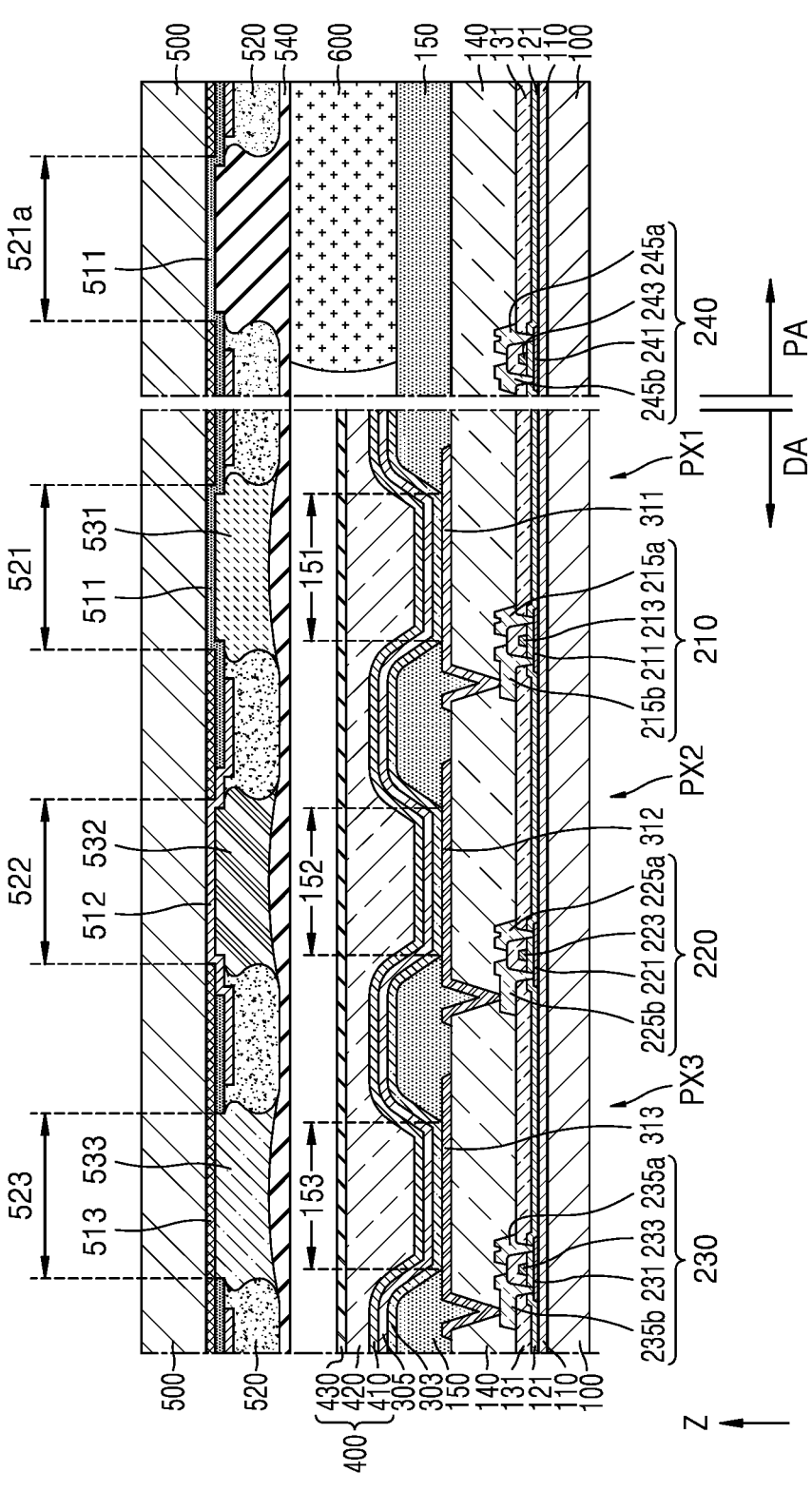
FIG. 6 is a schematic cross-sectional view of a portion of a display apparatus according to some embodiments.

FIG. 6 is a schematic cross-sectional view of a portion of a display apparatus according to some embodiments. As shown in FIG. 6, the display apparatus according to some embodiments may further include an overcoat layer 540. The overcoat layer 540 covers the bank 520, the first quantum dot layer 531, the second quantum dot layer 532, and the light-transmitting layer 533. In addition, the over-coat layer 540 fills the first additional opening 521a of the bank 520. In this case, the bonding member 600 contacts the overcoat layer 540.

The overcoat layer 540 may protect the first quantum dot layer 531, the second quantum dot layer 532, and the light-transmitting layer 533. The overcoat layer 540 may include an inorganic material such as silicon oxide, silicon nitride, silicon oxynitride, or the like, and may be formed by CVD. According to some embodiments, the overcoat layer 540 may have a double-layer structure including a silicon oxide layer and a silicon nitride layer. Alternatively, the overcoat layer 540 may be formed from an organic material such as acryl, epoxy, BCB, HMDSO, or the like.

Figure 7:
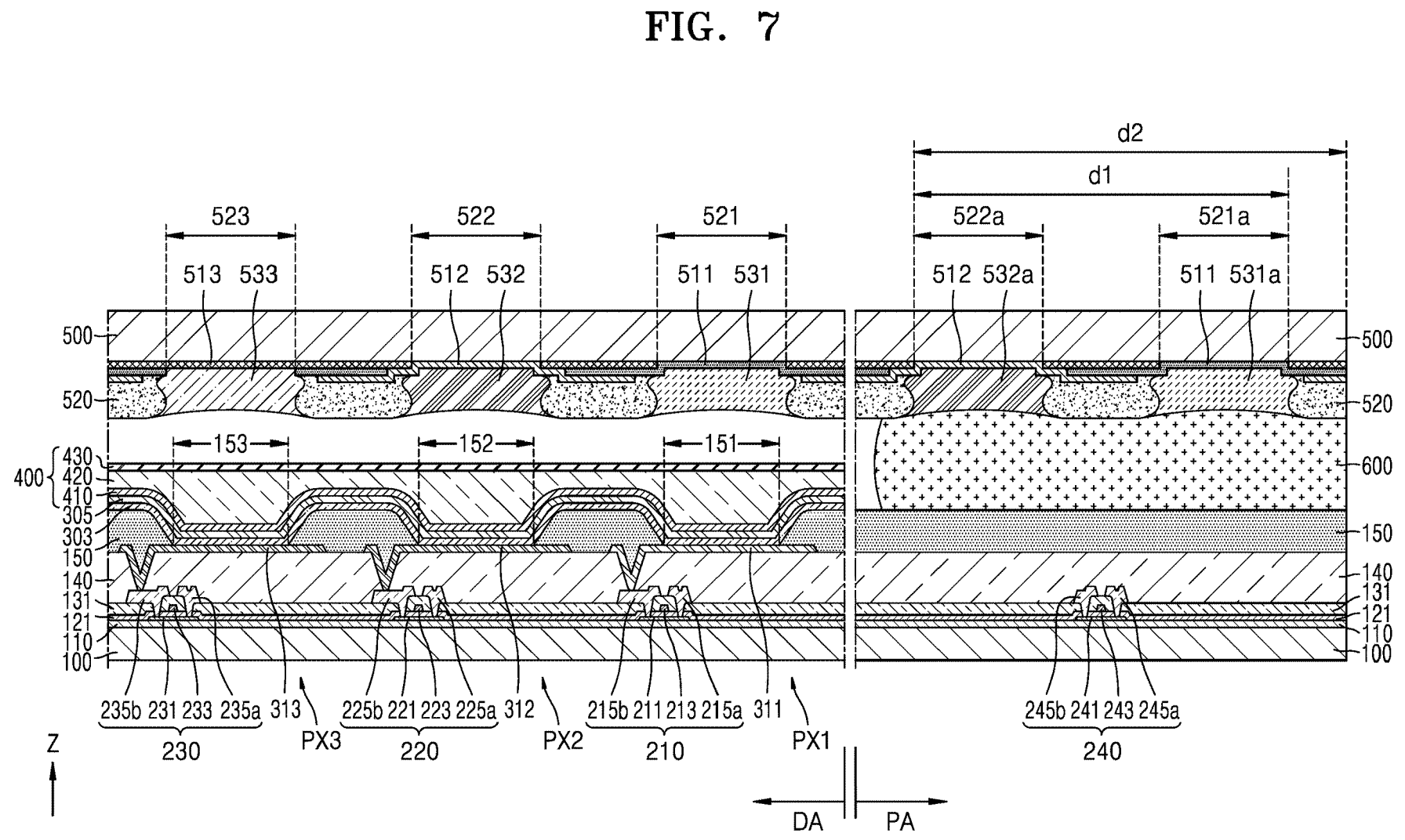

FIG. 7 is a schematic cross-sectional view of a portion of a display apparatus according to some embodiments. As shown in FIG. 7, the display apparatus according to some embodiments may further include a second additional opening 522a, in addition to the first additional opening 521a.

The first dummy quantum dot layer 531a may be in the first additional opening 521a of the bank 520. The first dummy quantum dot layer 531a may include a same material as the first quantum dot layer 531. The material for forming the first dummy quantum dot layer 531a may be, through the inkjet printing method, in the first additional opening 521a of the bank 520. A second dummy quantum dot layer 532a may be in the second additional opening 522a of the bank 520. The second dummy quantum dot layer 532a may include a same material as the second quantum dot layer 532. A material for forming the second dummy quantum dot layer 532a may be in the second additional opening 522a of the bank 520 through the inkjet printing method. Alternatively, a dummy light-transmitting layer may be in the second additional opening 522a of the bank 520. The dummy light-transmitting layer may include a same material as the light-transmitting layer 533. A material for forming the dummy light-transmitting layer may be in the second additional opening 522a of the bank 520 through the inkjet printing method. However, the bank 520 may define a third additional opening in addition to the first additional opening 521a and the second additional opening 522a, the first dummy quantum dot layer 531a may be in the first additional opening 521a, the second dummy quantum dot layer 532a may be in the second additional opening 522a, and the dummy light-transmitting layer may be in the third additional opening. In this case, an arrangement order of the first additional opening 521a, the second additional opening 522a, and the third additional opening may be variously modified. Hereinafter, for convenience, a case in which the second dummy quantum dot layer 532a is in the second additional opening 522a will be described.

In the display apparatus according to some embodiments, the bank 520 defines the first additional opening 521a and the second additional opening 522a in the peripheral area PA. Accordingly, instead of all or most of the portions in the peripheral area PA from among the portions in the temporary layer for forming the bank 520, only some of the portions are exposed. Therefore, in the exposure process, excessive exposure of the first portion, which is the portion adjacent to the peripheral area PA in the temporary layer, may be efficiently prevented or reduced as much as possible. As a result, a width or height of the portion of the bank 520 in the display area DA adjacent to the peripheral area PA may be identical or similar to a width or height of the portion of the bank 520 at the center of the display area DA.

In the display apparatus according to some embodiments, when a same electrical signal is applied to the pixel corresponding to the first quantum dot layer 531 in the first opening 521 adjacent to the peripheral area PA and a pixel corresponding to the first quantum dot layer 531 in the center of the display area DA, color coordinates and/or amounts of light emitted from the two pixels may be identical or similar to each other. Accordingly, a display apparatus configured to display high-quality images may be implemented.

The bonding member 600 is between the first substrate 100 and the second substrate 500, and binds the first substrate 100 and the second substrates 500 to each other. The bonding member 600 may be in the peripheral area PA, and may overlap the first additional opening 521a and the second additional opening 522a of the bank 520. The bonding member 600 may include a sealing member, for example, a sealant.

In the display apparatus according to some embodiments including a plurality of additional openings, as shown in FIG. 7, the second additional opening 522a may be an innermost additional opening with reference to the center of the display area DA from among the additional openings, and the first additional opening 521a may be an outermost additional opening with reference to the center of the display area DA from among the additional openings. In this case, assuming a distance from an inner side surface of the second additional opening 522a in the direction to the display area DA to an inner side surface of the first additional opening 521a in a direction away from the display area DA is a first distance d1 and a distance from the inner side surface of the second additional opening 522a in the direction to the display area DA to an outer edge of the bank 520 is a second distance d2, a ratio of the first distance d1 to the second distance d2, that is, d1/d2, may be greater than 12% and may be less than 80%. The descriptions will be applied to embodiments and modifications to be described in more detail later.

When the d1/d2 is equal to or less than 12%, a width of the outermost portion of the bank 520 may excessively increase. In this case, as described above with reference to FIG. 4, in the case of an opening relatively adjacent to the peripheral area PA among the openings of the bank 520 in the display area DA, an area of the opening relatively adjacent to the peripheral area PA may be smaller than an area of another opening in a view from the direction (the Z axis direction) perpendicular to the second substrate 500). In addition, a portion of the bank 520 to define an opening that is relatively adjacent to the peripheral area PA from among the openings of the bank 520 in the display area DA may have a height greater than a height of the portion of the bank 520 in the center of the display area DA. As described above with reference to FIG. 4, this results in degradation of the quality of images implemented by the display apparatus. Accordingly, it is desirable that d1/d2 is greater than 12%.

When d1/d2 is equal to or greater than 80%, the widths of the outermost portion of the bank 520 may excessively decrease. In this case, a transistor that is located at the bottom of the outermost portion of the bank 520 as a part of the driving circuit unit and includes an oxide semiconductor layer is not sufficiently shielded by the outermost portion of the bank 520, and thus, may be damaged by the external light from the outside or misoperate due to the external light. Accordingly, it is desirable that d1/d2 is less than 80%.

Also, in the case of the display apparatus according to some embodiments, the fourth thin-film transistor 240 included in the driving circuit unit may be located over the first substrate 100 in the peripheral area PA. The driving circuit unit may include, for example, a gate driver configured to generate scan signals to be provided to the display area DA through the scan line SL. The bank 520 may overlap the driving circuit unit. In detail, in a view from the direction (the Z axis direction) perpendicular to the second substrate 500, the bank 520 may overlap the driving circuit unit. FIG. 7 illustrates that, in a view from the direction (the Z axis direction) perpendicular to the second substrate 500, a portion between the first additional opening 521a and the second additional opening 522a of the bank 520 overlaps the fourth thin-film transistor 240.

By doing so, it is possible to effectively prevent, reduce, or minimize the external light, which is incident to the second substrate 500 from the outside of the second substrate 500, from reaching the fourth thin-film transistor 240. To do so, the bank 520 may include a light-shielding material such as a black matrix material, a red dye, a violet dye, or a blue dye. Alternatively, the reflectivity on the surface of the bank 520 may be improved by having the bank 520 include $TiO_2$ or a metal oxide, and by doing so, it is possible to effectively prevent, reduce, or minimize the external light, which is incident to the second substrate 500 from the outside of the second substrate 500, from reaching the fourth thin-film transistor 240. The descriptions will be applied to embodiments and modifications to be described in more detail later.

Figure 8:
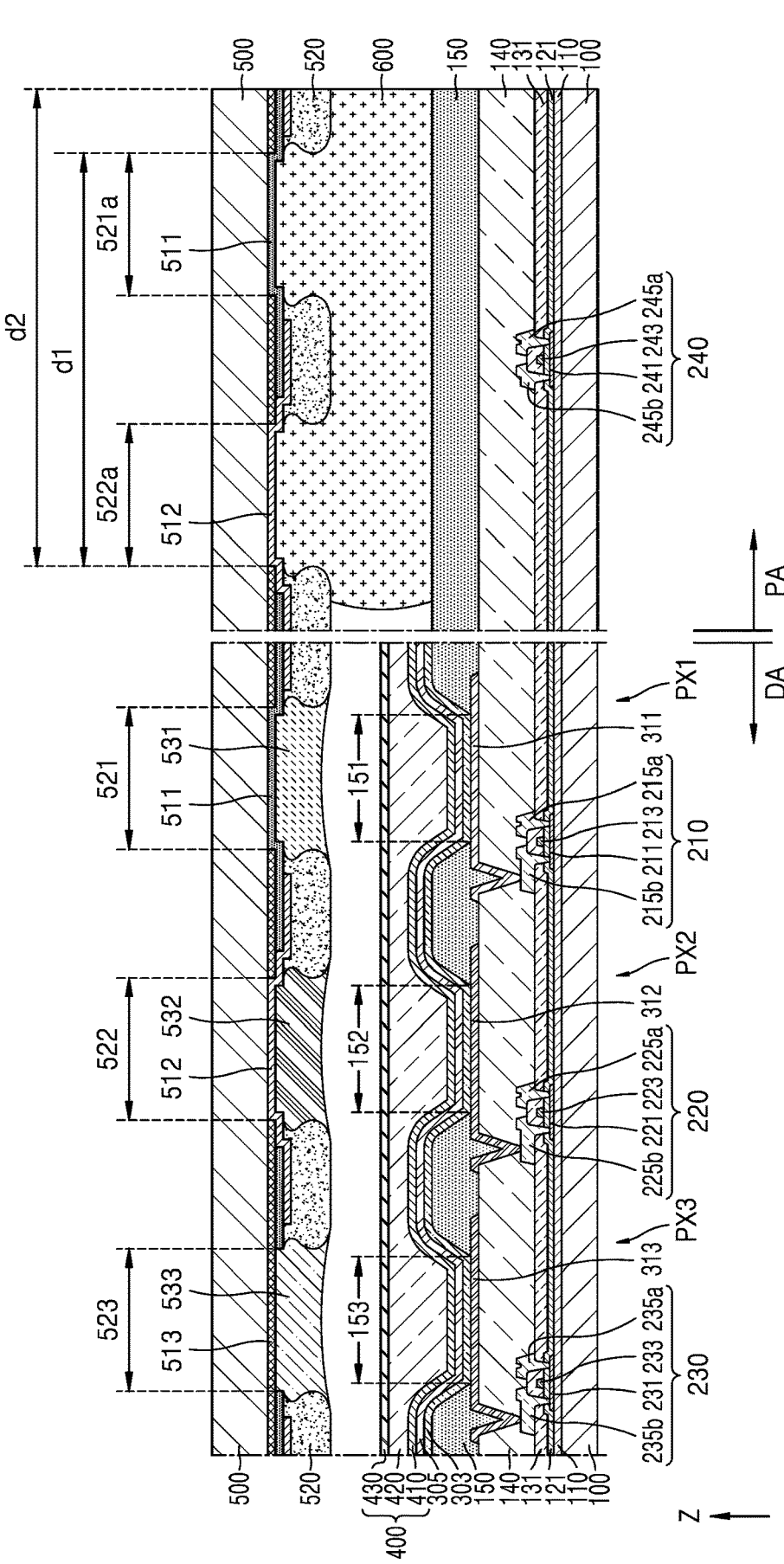
FIG. 8 is a schematic cross-sectional view of a portion of a display apparatus according to some embodiments.

FIG. 8 is a schematic cross-sectional view of a portion of a display apparatus according to some embodiments. The display apparatus according to the embodiments described with respect to FIG. 8 are different from the display apparatus described with reference to FIG. 7 in that the display apparatus according to the embodiments described with respect to FIG. 8 does not include the first dummy quantum dot layer 531a and the second dummy quantum dot layer 532a. Accordingly, it may be possible to implement a display apparatus displaying high-quality images by having the bank 520 define the first additional opening 521a and the second additional opening 522a in the peripheral area PA even when the display apparatus does not include the first dummy quantum dot layer 531a and the second dummy quantum dot layer 532a. In this case, the bonding member 600 may fill the first additional opening 521a and the second additional opening 522a of the bank 520.

Figure 9:
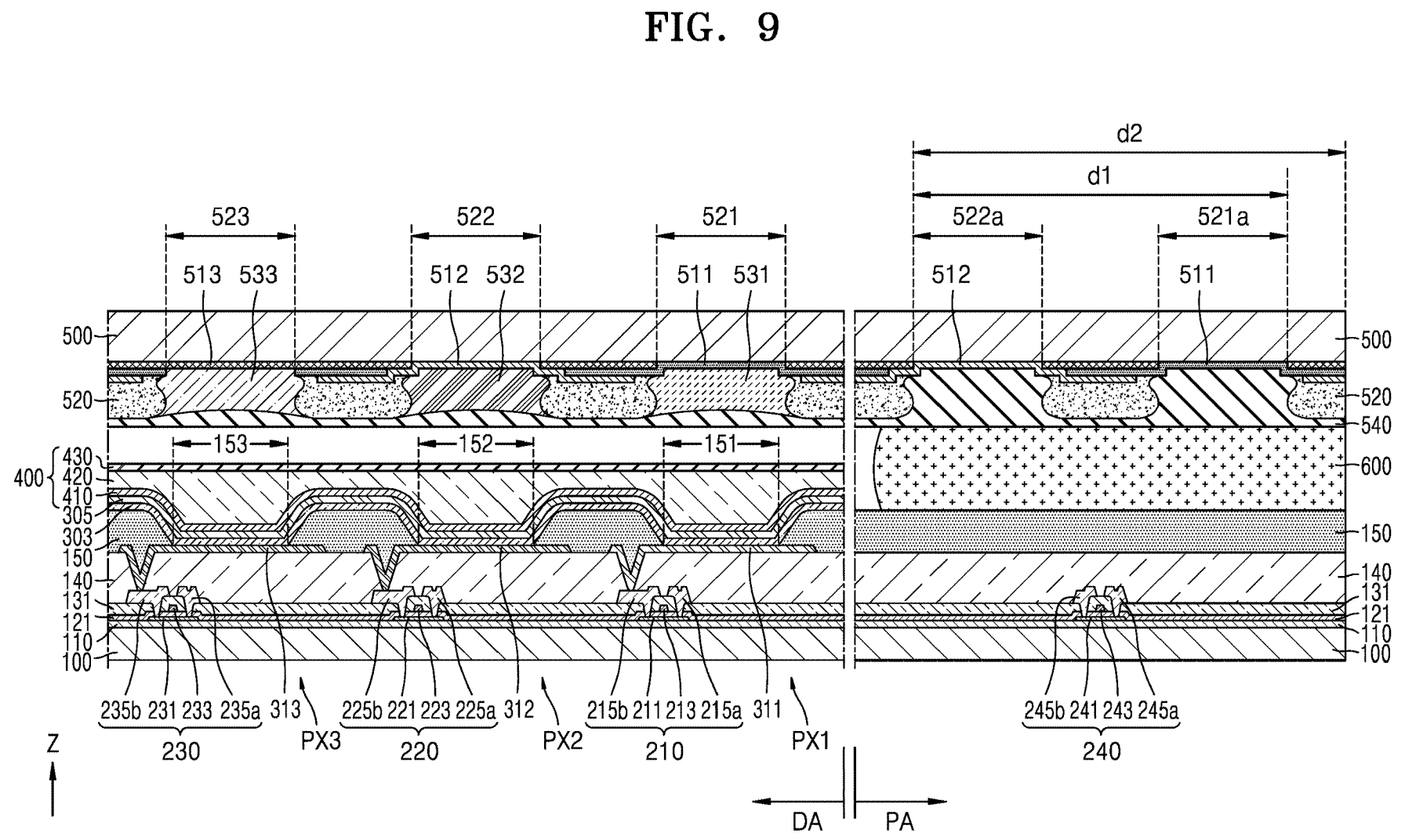

FIG. 9 is a schematic cross-sectional view of a portion of a display apparatus according to some embodiments. As shown in FIG. 9, the display apparatus according to some embodiments may further include the overcoat layer 540. The overcoat layer 540 covers the bank 520, the first quantum dot layer 531, the second quantum dot layer 532, and the light-transmitting layer 533. In addition, the overcoat layer 540 fills the first additional opening 521a and the second additional opening 522a of the bank 520. In this case, the bonding member 600 contacts the overcoat layer 540.

The overcoat layer 540 may protect the first quantum dot layer 531, the second quantum dot layer 532, and the light-transmitting layer 533. The overcoat layer 540 may include an inorganic material such as silicon oxide, silicon nitride, silicon oxynitride, or the like, and may be formed by CVD. According to some embodiments, the overcoat layer 540 may have a double-layer structure including a silicon oxide layer and a silicon nitride layer. Alternatively, the overcoat layer 540 may be formed from an organic material such as acryl, epoxy, BCB, HMDSO, or the like.

Figure 10:
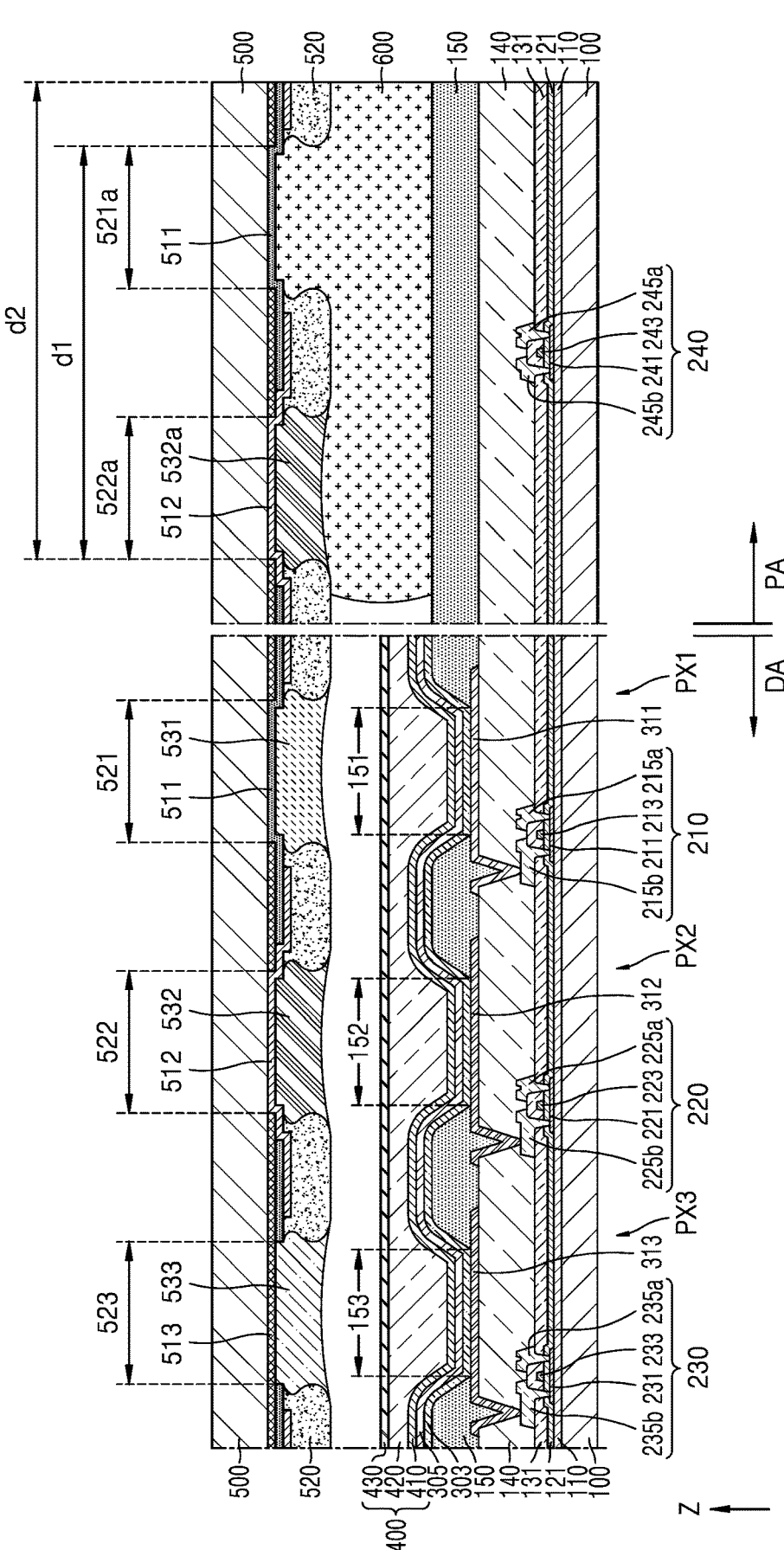
FIG. 10 is a schematic cross-sectional view of a portion of a display apparatus according to some embodiments.

FIG. 10 is a schematic cross-sectional view of a portion of a display apparatus according to some embodiments. As shown in FIG. 10, like the display apparatus described above with reference to FIG. 9, the display apparatus according to some embodiments does not include the first dummy quantum dot layer 531a, but includes the second dummy quantum dot layer 532a, unlike the display apparatus described above with reference to FIG. 9. In the case of the display apparatus according to some embodiments, it is possible to implement a display apparatus displaying high-quality images by having the bank 520 define the first additional opening 521a and the second additional opening 522a in the peripheral area PA. In this case, the bonding member 600 may fill the first additional opening 521a of the bank 520.

Figure 11:
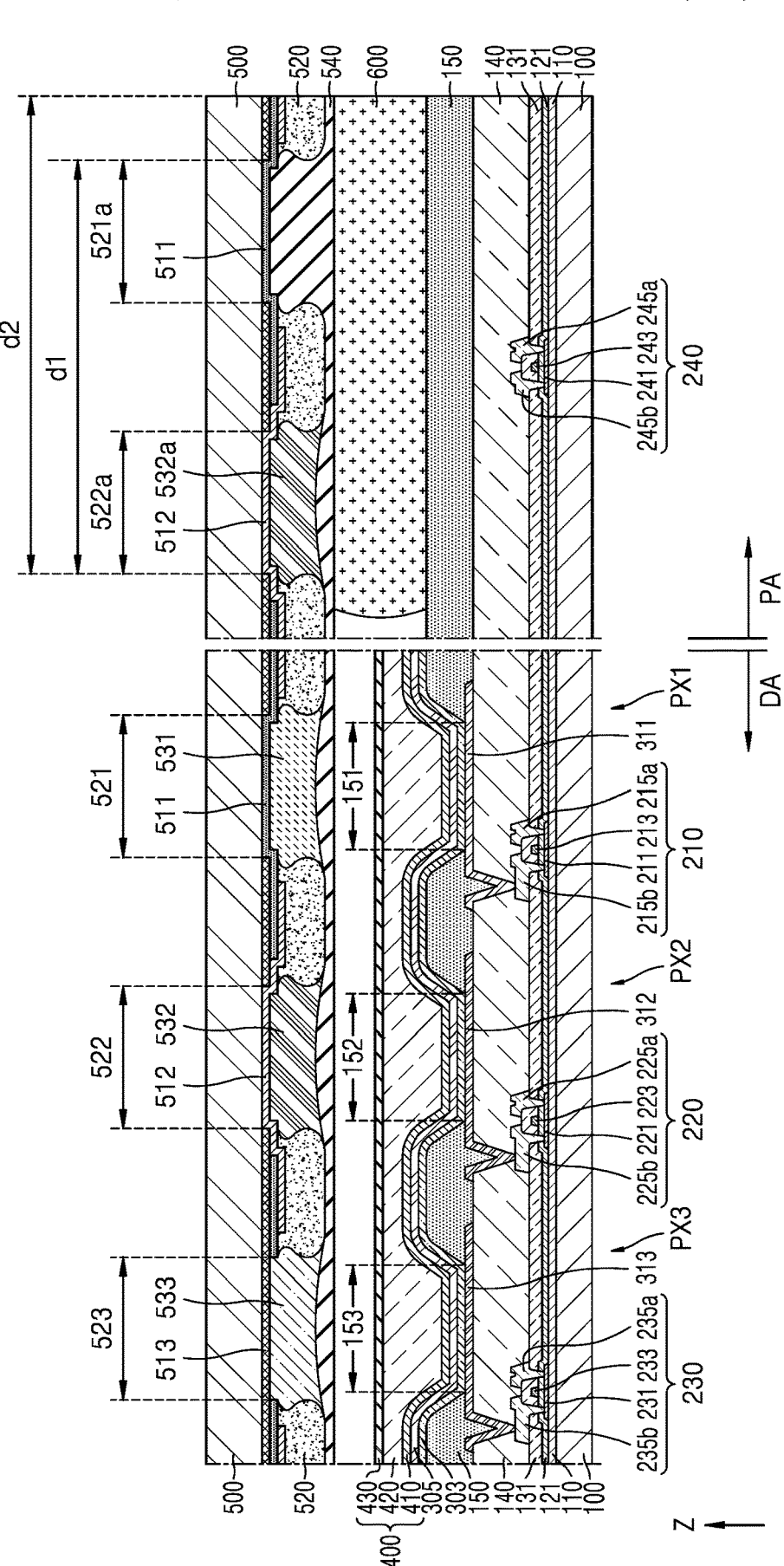
FIG. 11 is a schematic cross-sectional view of a portion of a display apparatus according to some embodiments.

FIG. 11 is a schematic cross-sectional view of a portion of the display apparatus according to some embodiments. As shown in FIG. 11, the display apparatus according to some embodiments may further include the overcoat layer 540. The overcoat layer 540 covers the bank 520, the first quantum dot layer 531, the second quantum dot layer 532, and the light-transmitting layer 533. In addition, the overcoat layer 540 covers the second dummy quantum dot layer 532a and fills the first additional opening 521a of the bank 520. In this case, the bonding member 600 contacts the overcoat layer 540.

The overcoat layer 540 may protect the first quantum dot layer 531, the second quantum dot layer 532, the light-transmitting layer 533, and the second dummy quantum dot layer 532a. The overcoat layer 540 may include an inorganic material such as silicon oxide, silicon nitride, silicon oxynitride, or the like, and may be formed by CVD. According to some embodiments, the overcoat layer 540 may have a double-layer structure including a silicon oxide layer and a silicon nitride layer. Alternatively, the overcoat layer 540 may be formed from an organic material such as acryl, epoxy, BCB, HMDSO, or the like.

Figure 12:
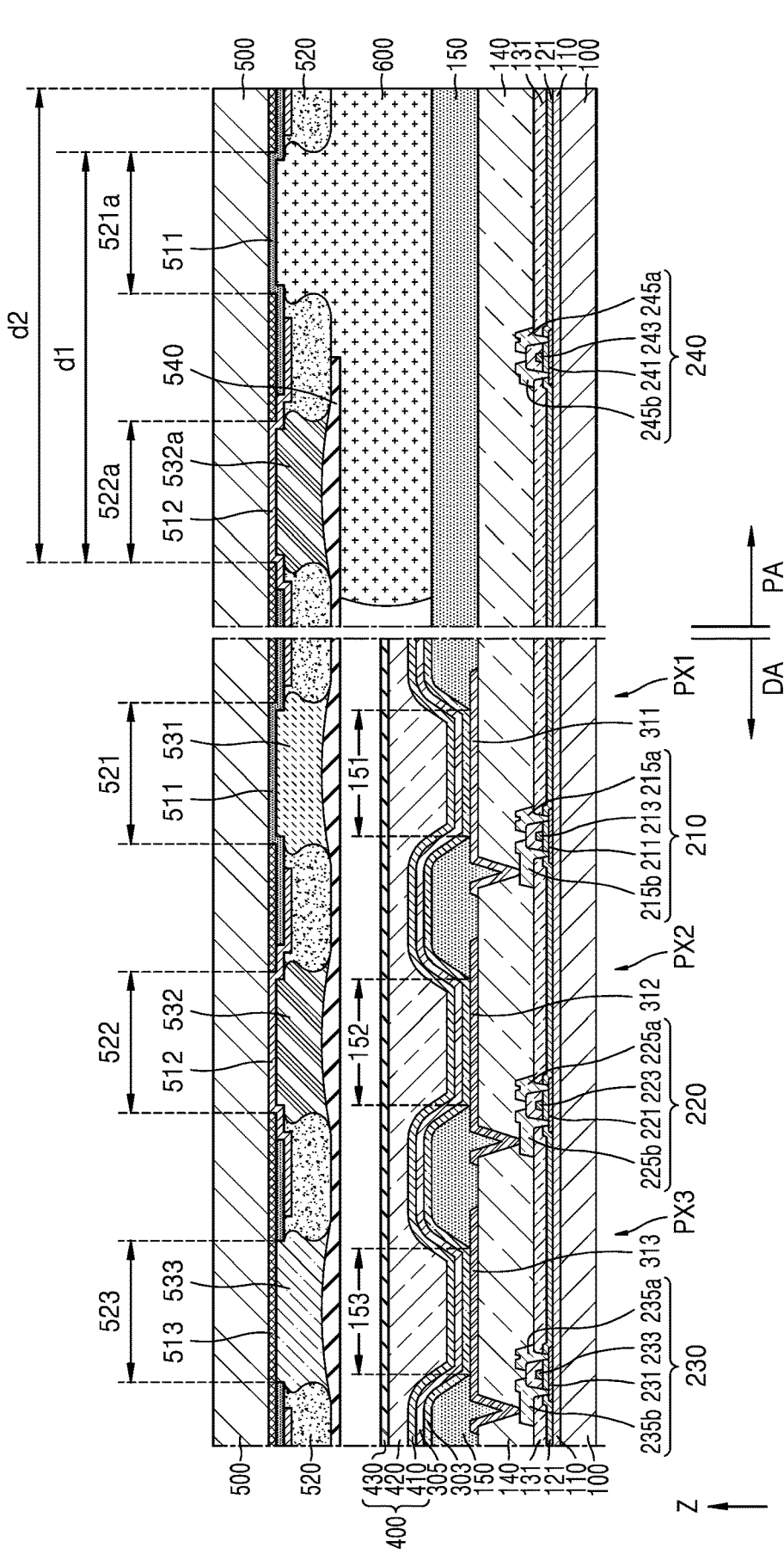
FIG. 12 is a schematic cross-sectional view of a portion of a display apparatus according to some embodiments.

FIG. 12 is a schematic cross-sectional view of a portion of a display apparatus according to some embodiments. As shown in FIG. 12, the overcoat layer 540 may cover the second dummy quantum dot layer 532a. However, unlike the display apparatus described with reference to FIG. 11, in the case of the display apparatus according to some embodiments, the overcoat layer 540 may not fill the first additional opening 521a of the bank 520. In this case, the bonding member 600 may contact with the overcoat layer 540 and fill the first additional opening 521a. In the display apparatus according to some embodiments, the first additional opening 521a may be located in a greater distance from the display area DA than the second additional opening 522a. That is, a distance from the center of the display area DA to a center of the first additional opening 521a may be greater than a distance from the center of the display area DA to a center of the second additional opening 522a.

Figure 13:
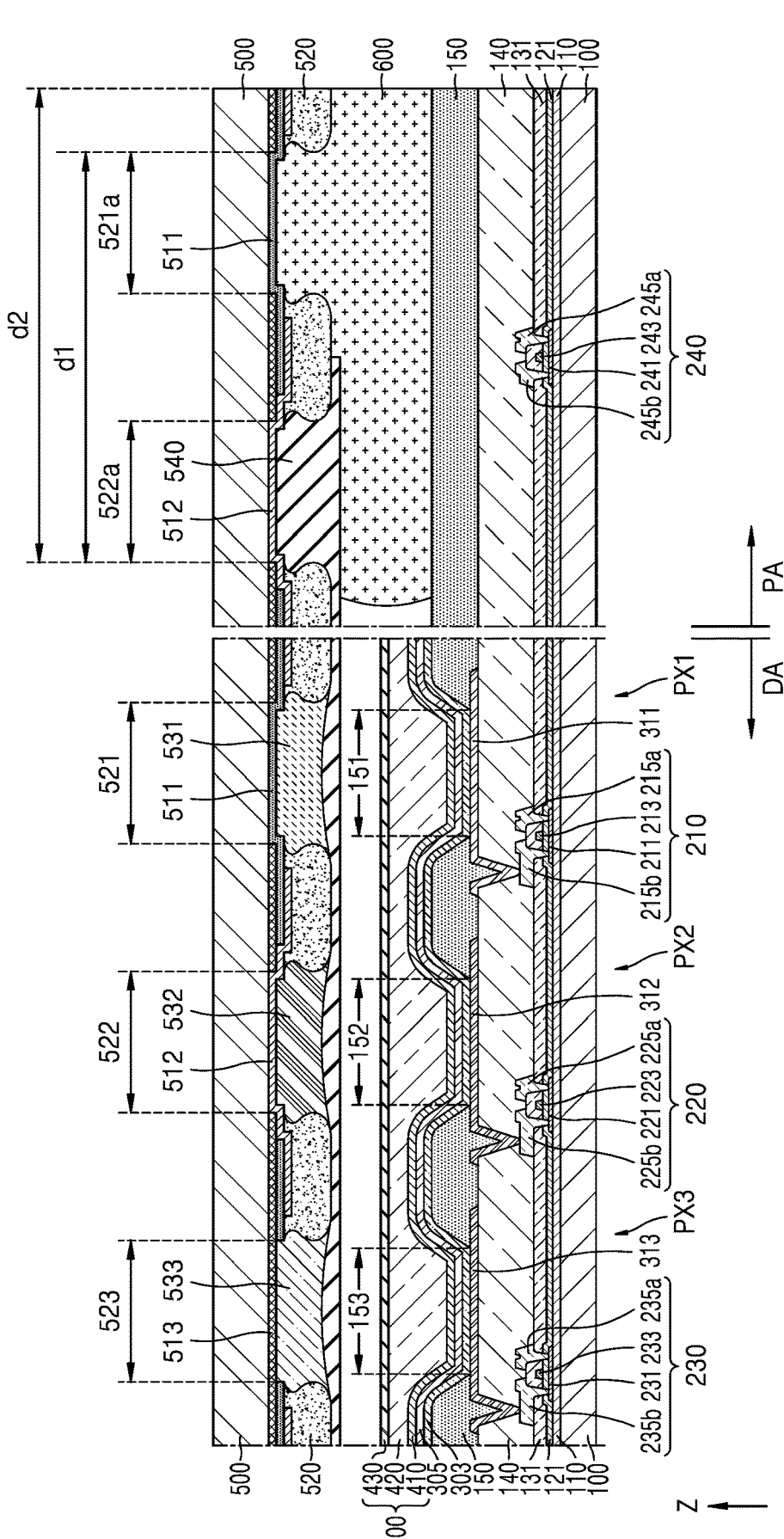
FIG. 13 is a schematic cross-sectional view of a portion of a display apparatus according to some embodiments.

FIG. 13 is a schematic cross-sectional view of a portion of a display apparatus according to some embodiments. As shown in FIG. 13, the display apparatus according to some embodiments may not include the first dummy quantum dot layer 531a and the second dummy quantum dot layer 532a. The overcoat layer 540 covers the bank 520, the first quantum dot layer 531, the second quantum dot layer 532, and the light-transmitting layer 533. In addition, the overcoat layer 540 does not fill the first additional opening 521a of the bank 520 and only fills the second additional opening 522a of the bank 520. In this case, the bonding member 600 may contact the overcoat layer 540 and fill the first additional opening 521a. In the display apparatus according to some embodiments, the first additional opening 521a may be located in a greater distance from the display area DA than the second additional opening 522a. That is, a distance from the center of the display area DA to a center of the first additional opening 521a may be greater than a distance from the center of the display area DA to a center of the second additional opening 522a.

Figure 14:
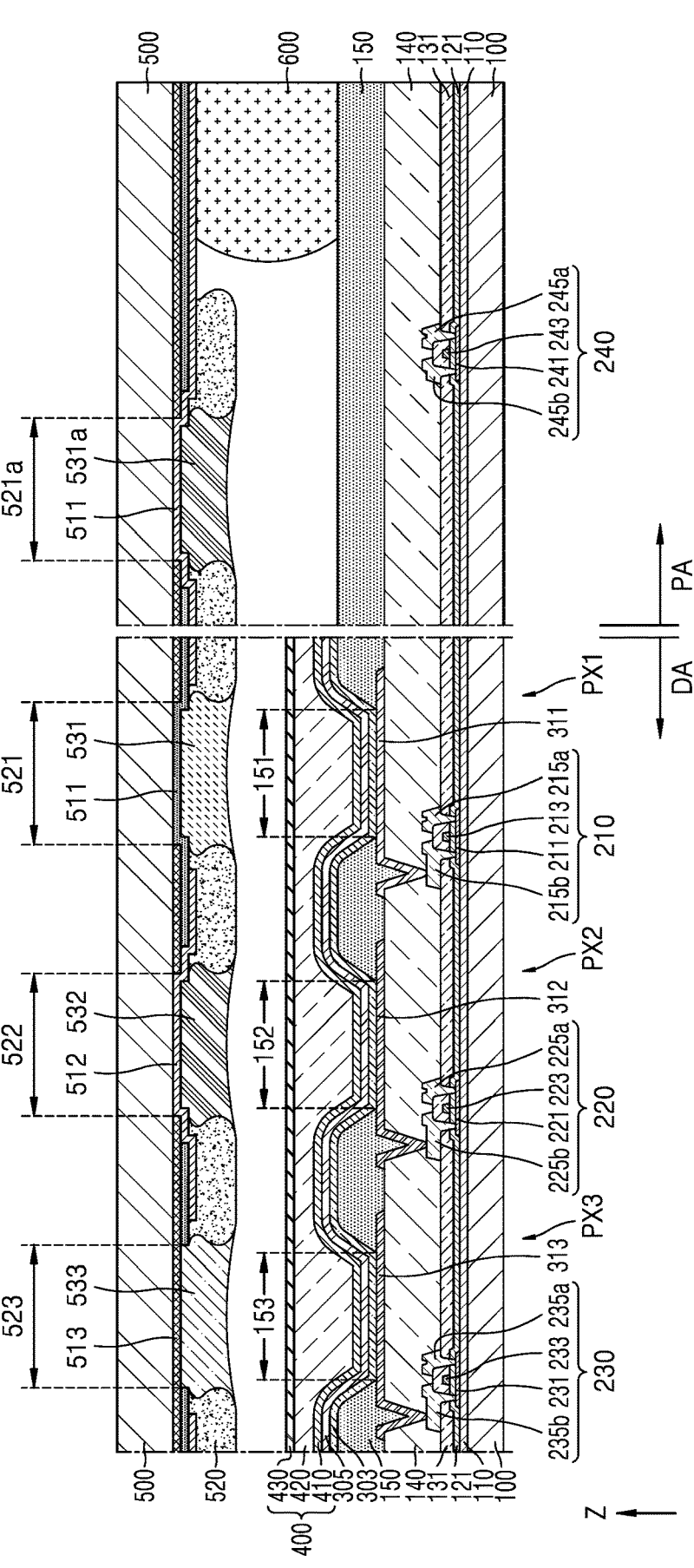
FIG. 14 is a schematic cross-sectional view of a portion of a display apparatus according to some embodiments.

Up to now, a case in which the bonding member 600 overlaps the first additional opening 521a is described, but the embodiments are not limited thereto. For example, as shown in FIG. 14, which is a schematic cross-sectional view of a portion of a display apparatus according to some embodiments, the bonding member 600 may be apart from the bank 520. That is, in a view from the direction (the Z axis direction) perpendicular to the first substrate 100, the bonding member 600 may not overlap the bank 520.

In this case, as described above with reference to FIGS. 3 and 7, the first dummy quantum dot layer 531a may be in the first additional opening 521a of the bank 520. The first dummy quantum dot layer 531a may include a material that is the same as the first quantum dot layer 531. A material for forming the first dummy quantum dot layer 531a may be, through the inkjet printing method, in the first additional opening 521a of the bank 520. Except that the bonding member 600 is apart from the bank 520, the description of the embodiments with reference to FIGS. 3 and 7 may also be applied to the display apparatus according to some embodiments as shown in FIG. 14.

As shown in FIG. 14, at least two color filter layers may be located between the bonding member 600 and the second substrate 500. FIG. 14 illustrates that the first color filter layer 511, the second color filter layer 512, and the third color filter layer 513 are located between the bonding member 600 and the second substrate 500. By arranging the at least two color filter layers between the bonding member 600 and the second substrate 500, light incident to the bonding member 600 may be blocked, and therefore, degradation in the performance of the bonding member 600 may be effectively prevented or reduced.

Figure 15:
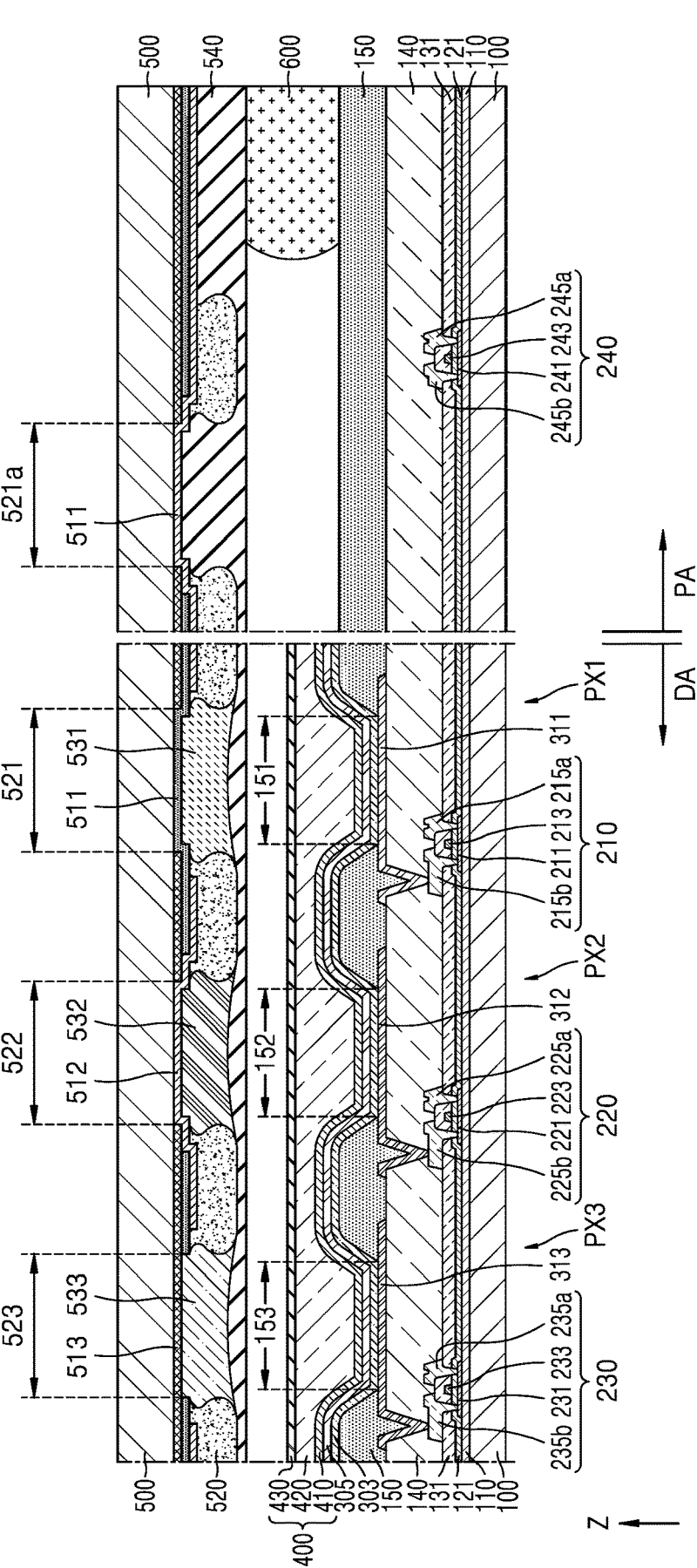
FIG. 15 is a schematic cross-sectional view of a portion of a display apparatus according to some embodiments.

In a state where the bonding member 600 is apart from the bank 520, as shown in FIG. 15, which is a schematic cross-sectional view of a portion of a display apparatus according to some embodiments, the overcoat layer 540 may cover the bank 520, the first quantum dot layer 531, the second quantum dot layer 532, and the light-transmitting layer 533. In addition, the overcoat layer 540 may fill the first additional opening 521a of the bank 520. In this case, the bonding member 600 contacts the overcoat layer 540. Except that the bonding member 600 does not overlap the bank 520 in a view from the direction (the Z axis direction) perpendicular to the first substrate 100, the description with reference to FIG. 9 may also be applied to the display apparatus according to some embodiments as shown in FIG. 15.

Figure 16:
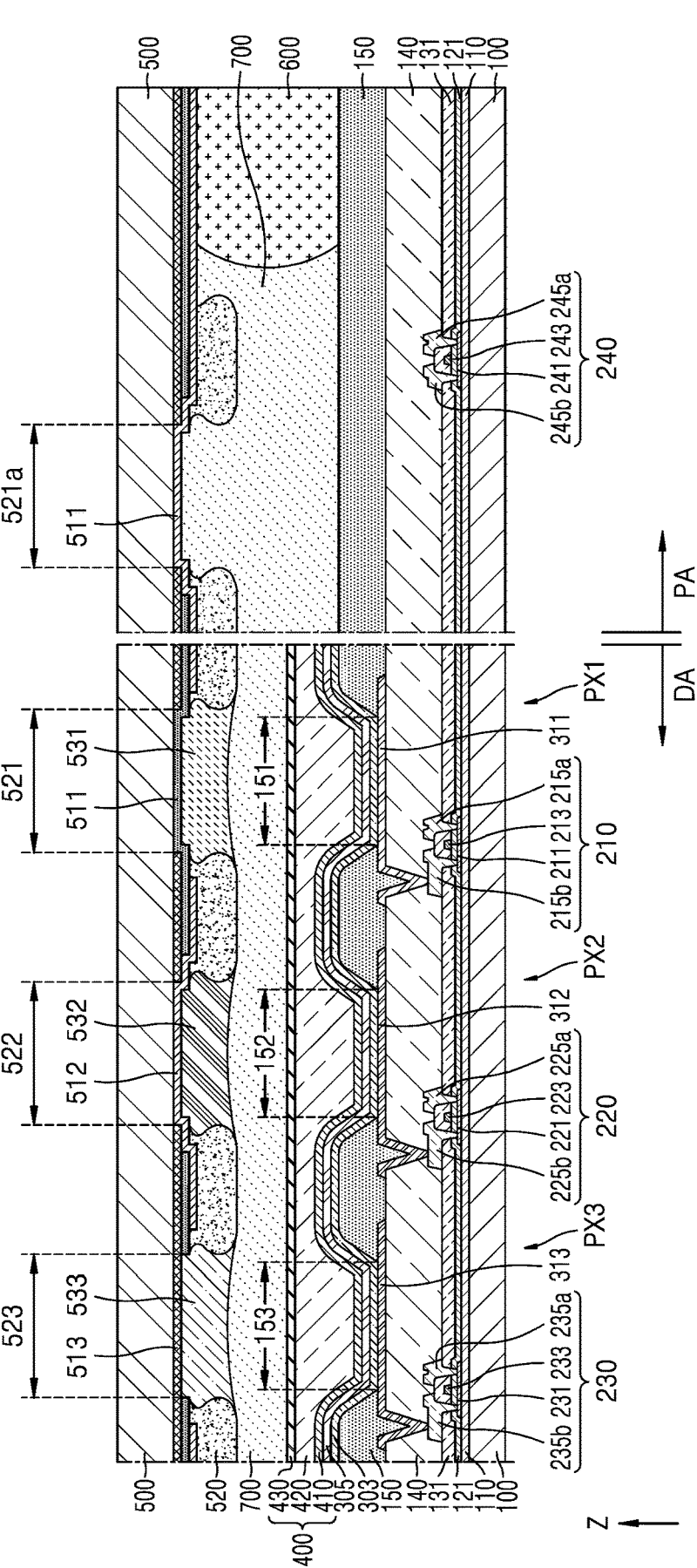
FIG. 16 is a schematic cross-sectional view of a portion of a display apparatus according to some embodiments.

FIG. 16 is a schematic cross-sectional view of a portion of a display apparatus according to some embodiments. In the state where the bonding member 600 is apart from the bank 520, a filler 700 may be located between the first substrate 100 and the second substrate 500. For example, the filler 700 may fill a space between the opposite electrode 305 and the bank 520, for example, a space between the first quantum dot layer 531, the second quantum dot layer 532, the light-transmitting layer 533, and the bank 520 and the encapsulation layer 400. Such filler may include a resin like acryl or epoxy. In this case, as shown in FIG. 16, the filler 700 may fill the first additional opening 521a.

Figure 17:
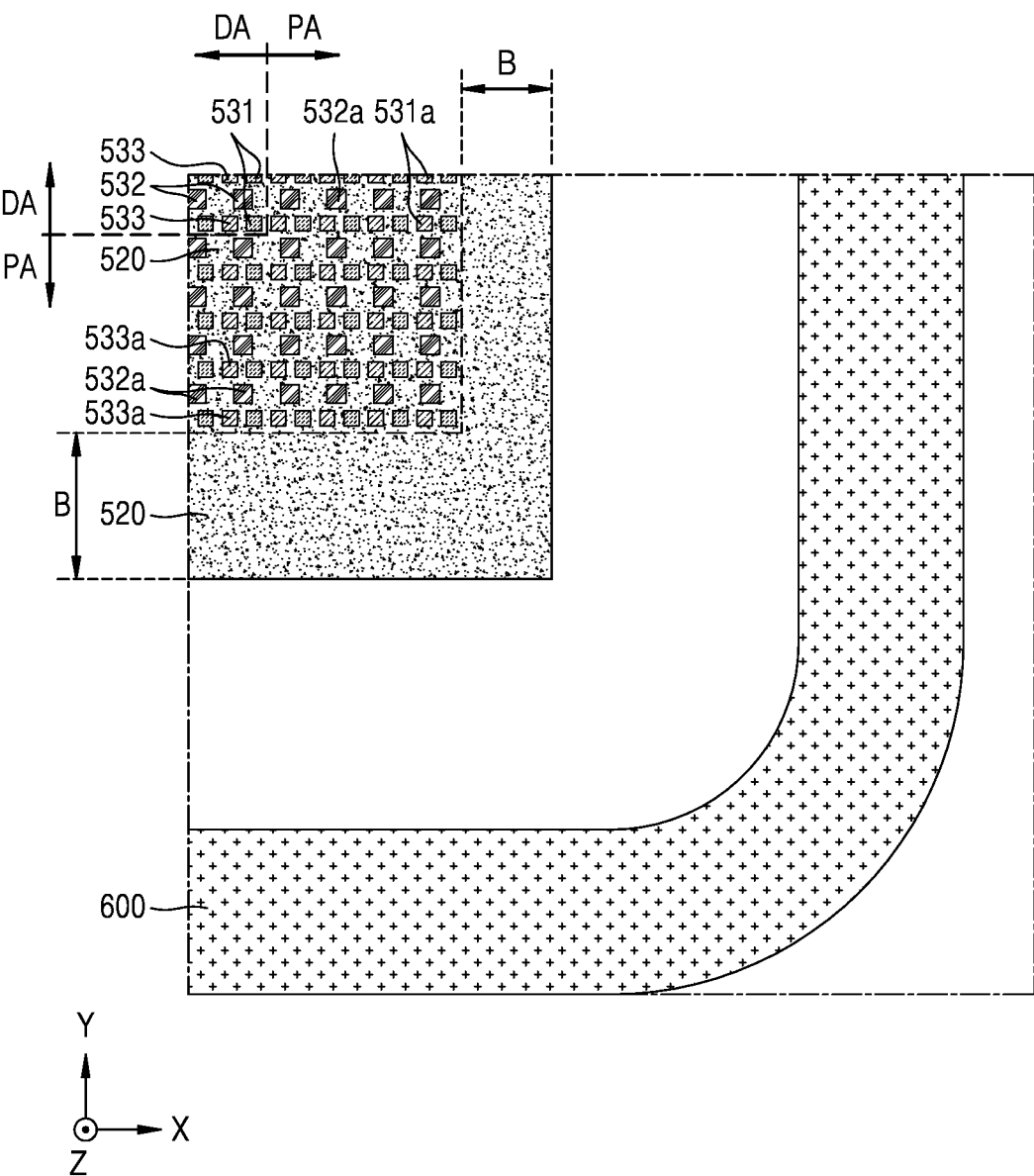
FIG. 17 is a schematic top-plan view of a portion of a display apparatus according to some embodiments.

FIG. 17 is a schematic top-plan view of a portion of a display apparatus according to some embodiments. For example, FIG. 17 may be a schematic top-plan view of a portion of a display apparatus shown in FIG. 14, or may be a schematic top-plan view of a portion of a display apparatus according to some embodiments. For convenience, FIG. 17 only illustrates the bank 520, the first quantum dot layer 531, the second quantum dot layer 532, the light-transmitting layer 533, the first dummy quantum dot layer 531a, the second dummy quantum dot layer 532a, a dummy light-transmitting layer 533a, and the bonding member 600.

As shown in FIG. 17, the bank 520 is located over the display area DA and the peripheral area PA outside the display area DA, and may define the first opening, the second opening, and the third opening in the display area DA, and may have the first additional opening, the second additional opening, and the third additional opening in the peripheral area PA. The first quantum dot layer 531 may be in the first opening, the second quantum dot layer 532 may be in the second opening, and the light-transmitting layer 533 may be in the third opening. The first dummy quantum dot layer 531a may be in the first additional opening, the second dummy quantum dot layer 532a may be in the second additional opening, and the dummy light-transmitting layer 533a may be in the third additional opening. Here, an arrangement order and positions of the first opening, the second opening, and the third opening may be variously modified, and an arrangement order and positions of the first additional opening, the second additional opening, and the third additional opening may also be variously modified.

According to some embodiments, as shown in FIG. 17, the bank 520 may have a thick portion having a thick shape without an opening or an additional opening as a portion marked B, at the outside of the portion where the first additional opening, the second additional opening, and the third additional opening are formed, in which the first dummy quantum dot layer 531a, the second dummy quantum dot layer 532a, and the dummy light-transmitting layer 533a are respectively located. As the bonding member 600 is apart from the bank 520, the bonding member 600 and the bank 520 may not overlap each other in a view from the direction (the Z axis direction) perpendicular to the first substrate 100.

According to some embodiments, the first color filter layer 511, the second color filter layer 512, and/or the third color filter layer 513 may be located to overlap the bank 520 and the bonding member 600. However, the first color filter layer 511, the second color filter layer 512, and/or the third color filter layer 513 may also overlap the space between the bank 520 and the bonding member 600.

Figure 18:
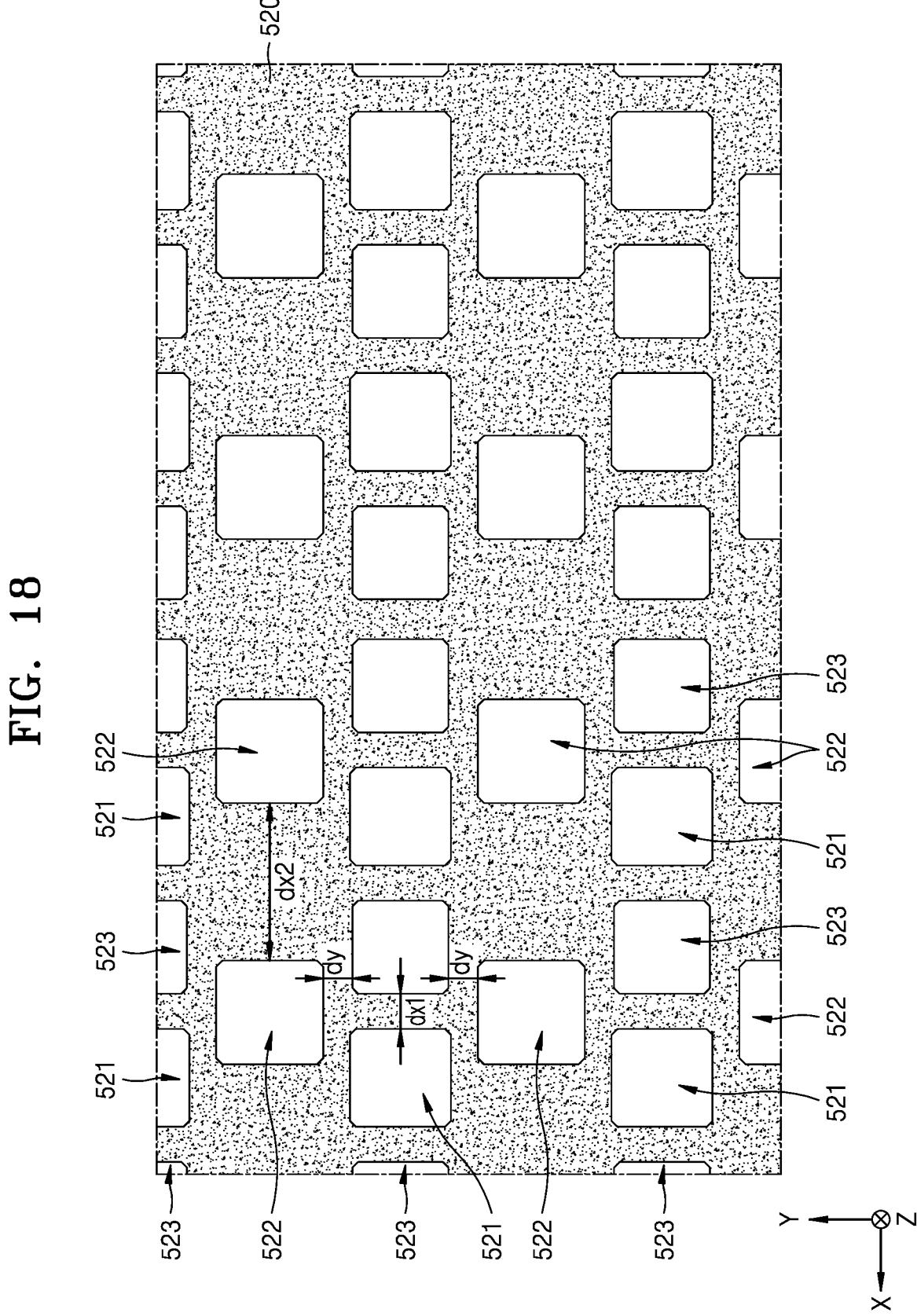
FIG. 18 is a schematic top-plan view of a display apparatus according to some embodiments.

FIG. 18 is a schematic top-plan view of a display apparatus according to some embodiments. For example, FIG. 18 is a top-plan view of the bank 520 in the direction (+Z axis direction) from the first substrate 100 toward the second substrate 500 in the display area DA.

As shown in FIG. 18, the bank 520 defines the first opening 521, the second opening 522, and the third opening 523.

A distance between the openings in the X axis direction, that is, a width of the bank 520 in the X axis direction, may be equal to or greater than 4 μm and less than or equal to 150 μm. FIG. 18 illustrates a width of the bank 520 between first opening 521 and the third opening 523 in the X axis direction as a first width dx1, and illustrates a width of the bank 520 between second openings 522 in the X axis direction as a second width dx2. Each of the first width dx1 and the second width dx2 may be equal to or greater than 4 μm and less than or equal to 150 μm. When the width of the bank 520 in the X axis direction is less than 4 μm, openings adjacent one another in the X direction may be connected to one another in a manufacturing process. When the width of the bank 520 in the X axis direction is greater than 150 μm, it may be difficult to implement the display image having high resolution, or an opening rate may decrease due to decrease in the area of the openings.

A distance between the openings in the Y axis direction, that is, a width of the bank 520 in the Y axis direction, may be equal to or greater than 4 μm and equal to or less than 20 μm. FIG. 18 illustrates the width of the bank 520 between the openings in the Y axis direction as a third width dy. When the width of the bank 520 in the Y axis direction is less than 4 μm, openings adjacent one another in the Y direction may be connected to one another in a manufacturing process. When the width of the bank 520 in the Y direction is greater than 20 μm, it may be difficult to implement the display apparatus having a high resolution, or an opening rate may decrease due to decrease in the area of the openings.

According to the embodiments described above, a display apparatus capable of displaying high-quality images may be implemented. However, the above-described characteristics do not limit the scope of embodiments according to the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
a first substrate having a display area and a peripheral area outside the display area;
a first pixel electrode over the first substrate in the display area;
a pixel defining layer covering an edge of the first pixel electrode such that a first pixel opening defined in the pixel defining layer exposes a center of the first pixel electrode;
an emission layer over the first pixel electrode and configured to emit light having a wavelength in a first wavelength band;
an opposite electrode over the emission layer;
a second substrate over the first substrate such that the opposite electrode is between the first substrate and the second substrate;
a bank over a bottom surface of the second substrate in a direction to the first substrate, a first opening defined in the bank to be surrounded by the bank and overlapping with the first pixel opening and a first additional opening defined in the bank to be surrounded by the bank and overlapping with the peripheral area,
a first quantum dot layer in the first opening; and
a bonding member between the first substrate and the second substrate and bonding the first substrate and the second substrate to each other.

2. The display apparatus of claim 1, wherein the bonding member overlaps the first additional opening.

3. The display apparatus of claim 1, wherein the bonding member is spaced apart from the bank.

4. The display apparatus of claim 1, further comprising a first dummy quantum dot layer in the first additional opening, the first dummy quantum dot layer comprising a same material as the first quantum dot layer.

5. The display apparatus of claim 4,
wherein the first quantum dot layer is configured to convert light having a wavelength in the first wavelength band and passing through the first quantum dot layer into light having a wavelength in a second wavelength band.

6. The display apparatus of claim 1, wherein the bonding member fills the first additional opening.

7. The display apparatus of claim 1,
further comprising an overcoat layer covering the bank and the first quantum dot layer and filling the first additional opening,
wherein the bonding member contacts the overcoat layer.

8. The display apparatus of claim 1, further comprising a filler filling a space between the opposite electrode and the bank, the filler filling the first additional opening.

9. The display apparatus of claim 1,
further comprising a second pixel electrode over the first substrate to be in the display area,
wherein the pixel defining layer covers an edge of the second pixel electrode such that a second pixel opening defined in the pixel defining layer exposes a center of the second pixel electrode,
the emission layer is over the second pixel electrode,
a second opening defined in the bank overlaps the second pixel opening, and
the display apparatus further comprises a second quantum dot layer or a light-transmitting layer, in the second opening.

10. The display apparatus of claim 9,
wherein a second additional opening is defined in the bank to overlap the peripheral area, and
the bonding member overlaps the second additional opening.

11. The display apparatus of claim 10, further comprising:
a first dummy quantum dot layer in the first additional opening, the first dummy quantum dot layer comprising a same material as the first quantum dot layer; and
a second dummy quantum dot layer or a dummy light-transmitting layer, in the second additional opening, wherein the second dummy quantum dot layer comprises a same material as the second quantum dot layer and the dummy light-transmitting layer comprises a same material as the light-transmitting layer.

12. The display apparatus of claim 11, wherein
the first quantum dot layer is configured to convert light having a wavelength in the first wavelength band and passing through the first quantum dot layer into light having a wavelength in a second wavelength band, and
the second quantum dot layer is configured to convert light having a wavelength in the first wavelength band and passing through the second quantum dot layer into light having a wavelength in a third wavelength band.

13. The display apparatus of claim 10, wherein the bonding member fills the first additional opening and the second additional opening.

14. The display apparatus of claim 10, further comprising a second dummy quantum dot layer in the second additional opening, the second dummy quantum dot layer comprising a same material as the second quantum dot layer.

15. The display apparatus of claim 14, wherein
the second quantum dot layer is configured to convert light having a wavelength in the first wavelength band and passing through the second quantum dot layer into light having a wavelength in a third wavelength band.

16. The display apparatus of claim 14, wherein the bonding member fills the first additional opening.

17. The display apparatus of claim 14, further comprising an overcoat layer covering the bank, the first quantum dot layer, the second quantum dot layer or the light-transmitting layer, and the second dummy quantum dot layer, the overcoat layer filling the first additional opening,
wherein the bonding member contacts the overcoat layer.

18. The display apparatus of claim 14, further comprising an overcoat layer covering the bank, the first quantum dot layer, the second quantum dot layer or the light-transmitting layer, and the second dummy quantum dot layer,
wherein the bonding member contacts the overcoat layer and fills the first additional opening.

19. The display apparatus of claim 18, wherein
a distance from a center of the display area to a center of the first additional opening is greater than a distance from the center of the display area to a center of the second additional opening.

20. The display apparatus of claim 10, wherein
the second additional opening is an innermost additional opening among additional openings with reference to a center of the display area, the first additional opening is an outermost additional opening among the additional openings with reference to the center of the display area, and
when a distance from an inner side surface of the second additional opening in a direction to the display area to an inner side surface of the first additional opening in a direction away from the display area is a first distance, and when a distance from the inner side surface of the second additional opening in the direction to the display area to an outer edge of the bank is a second distance, a ratio of the first distance to the second distance is greater than 12% and less than 80%.

21. The display apparatus of claim 10, further comprising an overcoat layer covering the bank, the first quantum dot layer, and the second quantum dot layer or the light-transmitting layer, the overcoat layer filling the first additional opening and the second additional opening,
wherein the bonding member contacts the overcoat layer.

22. The display apparatus of claim 10, further comprising an overcoat layer covering the bank, the first quantum dot layer, and the second quantum dot layer or the light-transmitting layer, the overcoat layer filling the second additional opening,
wherein the bonding member contacts the overcoat layer and fills the first additional opening.

23. The display apparatus of claim 22, wherein
a distance from a center of the display area to a center of the first additional opening is greater than a distance from the center of the display area to a center of the second additional opening.

24. The display apparatus of claim 1, further comprising a thin-film transistor over the first substrate and located in the peripheral area,
wherein the bank overlaps the thin-film transistor.

25. The display apparatus of claim 24, wherein the bank comprises a light-shielding material.

* * * * *